United States Patent
Hirase et al.

(10) Patent No.: US 8,253,180 B2
(45) Date of Patent: *Aug. 28, 2012

(54) SEMICONDUCTOR DEVICE

(75) Inventors: Junji Hirase, Osaka (JP); Akio Sebe, Osaka (JP); Naoki Kotani, Hyogo (JP); Gen Okazaki, Hyogo (JP); Kazuhiko Aida, Chiba (JP); Shinji Takeoka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/037,831

(22) Filed: Mar. 1, 2011

(65) Prior Publication Data

US 2011/0147857 A1 Jun. 23, 2011

Related U.S. Application Data

(62) Division of application No. 12/505,799, filed on Jul. 20, 2009, now Pat. No. 7,923,764, which is a division of application No. 11/491,260, filed on Jul. 24, 2006, now Pat. No. 7,579,227.

(30) Foreign Application Priority Data

Aug. 5, 2005 (JP) ................................. 2005-227457

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/295; 257/310; 257/395; 257/411

(58) Field of Classification Search .................. 257/295, 257/310, 296, 324, 410, 411, 368, 392, 393, 257/395, 369, 389, 405, 406
See application file for complete search history.

(56) References Cited

U.S. PATENT DOCUMENTS 6,642,071 B2  11/2003  Cheng
6,929,992 B1   8/2005  Djomehri et al.
(Continued)

FOREIGN PATENT DOCUMENTS

CN   1610129 A   4/2005
(Continued)

OTHER PUBLICATIONS

Watanabe, Ken, Partial English Translation of "HfSiON-CMOS technology for achieving high performance and high reliability," SEMI FORUM Japan, 2005 IT System & ULSI Technology.

(Continued)

*Primary Examiner* — Chuong A. Luu
(74) *Attorney, Agent, or Firm* — McDermott Will & Emery LLP

(57) ABSTRACT

A semiconductor device includes: a high dielectric constant gate insulating film formed on an active region in a substrate; a gate electrode formed on the high dielectric constant gate insulating film; and an insulating sidewall formed on each side surface of the gate electrode. The high dielectric constant gate insulating film is continuously formed so as to extend from under the gate electrode to under the insulating sidewall. At least part of the high dielectric constant gate insulating film located under the insulating sidewall has a smaller thickness than a thickness of part of the high dielectric constant gate insulating film located under the gate electrode.

22 Claims, 11 Drawing Sheets

U.S. PATENT DOCUMENTS

| | | | |
|---|---|---|---|
| 6,992,358 B2 | 1/2006 | Hieda et al. | |
| 7,579,227 B2 | 8/2009 | Hirase et al. | |
| 7,923,764 B2 * | 4/2011 | Hirase et al. | 257/295 |
| 2003/0022422 A1 | 1/2003 | Torii et al. | |
| 2004/0004234 A1 | 1/2004 | Yagishita et al. | |
| 2004/0129997 A1 | 7/2004 | Morifuji | |
| 2004/0227185 A1 | 11/2004 | Matsumoto et al. | |
| 2005/0121733 A1 | 6/2005 | Chen et al. | |
| 2005/0127436 A1 | 6/2005 | Henson et al. | |
| 2006/0121740 A1 | 6/2006 | Sakai et al. | |

FOREIGN PATENT DOCUMENTS

| | | |
|---|---|---|
| JP | 2003-258241 | 9/2003 |
| JP | 2004-172178 | 6/2004 |
| JP | 2004-356576 | 12/2004 |
| JP | 2005-064190 | 3/2005 |

OTHER PUBLICATIONS

Hori, Takashi, "1/4-µm LATID (LArge-Tilt-angle Implanted Drain) Technology for 3.3-V Operation", CH2637-7/89/0000-0777 1989 IEEE, IEDM 89-777-780-IEDM 89.

Sayama, et al., H.., "80nm CMOSFET Technology Using Double Offset-Implanted Source/Drain Extension and Low Temperature SiN Process", IEDM 2000, IEDM 00-239-242-IEDM 00.

U.S. Office Action issued in U.S. Appl. No. 11/543,865 dated on Nov. 12, 2008.

Chinese Office Action, with English Translation, issued in Chinese Patent Application No. CN 200610093872.2, dated Mar. 20, 2009.

Notice Allowance issued in U.S. Appl. No. 12/505,799, mailed Dec. 13, 2010.

* cited by examiner

SEMICONDUCTOR DEVICE

RELATED APPLICATIONS

This application is a Divisional of U.S. patent application Ser. No. 12/505,799, filed on Jul. 20, 2009, which is now U.S. Pat. No. 7,923,764, which is a Divisional of U.S. patent application Ser. No. 11/491,260, filed on Jul. 24, 2006, now U.S. Pat. No. 7,579,227, claiming priority of Japanese Patent Application No. 2005-227457, filed on Aug. 5, 2005, the entire contents of each of which are incorporated by reference.

BACKGROUND OF THE INVENTION

1. Field of the Invention

The present invention relates to a semiconductor device and a method for fabricating the semiconductor device. Specifically, the present invention relates to a structure of a MISFET (metal insulator semiconductor field-effect transistor) and a method for fabricating the MISFET and, more particularly, relates to techniques for improving the driving power and reliability of a MISFET.

2. Description of Prior Art

In recent years, as the degree of integration, function and operation speed of semiconductor integrated circuit devices have been highly improved, there have been attempts to reduce a junction depth of an extension according to a scaling rule and, at the same time, to use, as a gate insulating film of a MISFET, a high dielectric constant film formed of a Hf based oxide, Al based oxide or the like, which has a relative dielectric constant of 10 or more, instead of an $SiO_2$ based insulating film having a relative dielectric constant of about 4.

FIGS. 16A and 16B are cross-sectional views illustrating respective structures of known MISFETs using a high dielectric constant gate insulating film, respectively (see Ken Watanabe, *HfSiON-CMOS technology for achieving high performance and high reliability*, Semi. Forum Japan, 2005).

As shown in FIG. 16A, a gate electrode 105 is formed on a region of a well 102 surrounded by a STI (shallow trench isolation) 103. The region of the well 102 surrounded by the STI serves as an active region of a substrate 101. The gate electrode 105 is provided on the region with a high dielectric constant gate insulating film 104 interposed therebetween. An insulating sidewall 107 is formed on each side of the gate electrode 105. An extension region 110 is formed in part of the well 102 located under the insulating sidewall 107. A pocket region 111 is formed in part of the well 102 located under the extension region 110. Source/drain regions 112 are formed so that each of the source/drain regions 112 is provided in parts of the well 102 located at the external side to the extension region 110 and the pocket region 111 when viewed from the gate electrode 105.

A structure shown in FIG. 16B is different from a structure shown in FIG. 16A in that a sidewall 107 is formed on each side of a gate electrode 105 with an insulating offset sidewall 106 interposed therebetween. Thus, an overlapping amount of the gate electrode 105 and an extension region 110 can be optimized in a simple manner.

SUMMARY OF THE INVENTION

However, in a structure of a known MISFET using a high dielectric constant gate insulating film, side end portions of the high dielectric constant gate insulating film are in direct contact with sidewalls. Thus, in forming sidewalls of, for example, a silicon oxide film or the like, a composition of the side end portions of the high dielectric constant gate insulating film becomes closer to $SiO_2$ or like other inconvenience occurs. As a result, reduction in the dielectric constant and insulation property of the high dielectric constant gate insulating film is caused at gate electrode end part, so that device characteristics of the MISFET are deteriorated and the reliability of the gate insulating film is degraded.

In view of the above-described problems, it is therefore an object of the present invention to improve characteristics of a MISFET without degrading of a high dielectric constant gate insulating film.

To achieve the above-described object, the inventors of the present application have devised a MISFET structure in which a high dielectric constant gate insulating film is kept remaining under sidewalls to prevent end portions of the high dielectric constant gate insulating film from being in contact with the sidewalls, and a method for forming the MISFET structure. In the mean time, when the high dielectric constant gate insulating film is kept remaining under the sidewalls, a capacitance between gate/drain regions is increased, thus resulting in adverse effects on circuit speed. Also, in such cases, when extension implantation or LDD (lightly doped drain) implantation is performed, it is necessary to implant ions through a high dielectric constant film. Thus, when ion implantation is performed, expansion of an implanted impurity in the depth direction is increased, in other words, a junction point of an extension or an LDD is located at a large depth, so that desired device characteristics can not be obtained. This is because implantation acceleration energy is increased for the following reasons.

Reason 1) With use of a high dielectric constant film as a gate insulating film, a desired dielectric constant can be achieved even without having the thickness of the high dielectric constant film reduced. Therefore, the thickness of the high dielectric constant film has to be set at a large value.

Reason 2) A high dielectric constant film contains heavy metal and Rp (projection range) of implanted ions is small.

To cope with this problem, the inventors have devised a MISFET structure in which a high dielectric constant gate insulating film is kept remaining under sidewalls and part of the high dielectric constant gate insulating film located under the sidewalls is made to have a smaller thickness than a thickness of part of the high dielectric constant gate insulating film located under a gate electrode, and a method for forming the MISFET structure.

Specifically, a semiconductor device according to the present invention includes: a gate electrode formed on the high dielectric constant gate insulating film; and an insulating sidewall formed on each side surface of the gate electrode. In the semiconductor device, the high dielectric constant gate insulating film is continuously formed so as to extend from under the gate electrode to under the insulating sidewall, and at least part of the high dielectric constant gate insulating film located under the insulating sidewall has a smaller thickness than a thickness of part of the high dielectric constant gate insulating film located under the gate electrode.

In the semiconductor device of the present invention, the insulating sidewall may include a first insulating sidewall formed on a side surface of the gate electrode and a second insulating sidewall formed on the side surface of the gate electrode with the first insulating sidewall interposed therebetween, the high dielectric constant gate insulating film may be continuously formed so as to extend from under the gate electrode to under the first insulating sidewall, and part of the high dielectric constant gate insulating film located under the first insulating sidewall may have a smaller thickness than a thickness of part of the high dielectric constant gate insulating film located under the gate electrode.

When the insulating sidewall includes the first insulating sidewall and the second insulating sidewall, the high dielectric constant gate insulating film may be formed so as not to be located under the second insulating sidewall.

When the insulating sidewall includes the first insulating sidewall and the second insulating sidewall, the high dielectric constant gate insulating film may be continuously formed so as to extend from under the gate electrode to under the second insulating sidewall, and part of the high dielectric constant gate insulating film located under the second insulating sidewall may have the same thickness as a thickness of part of the high dielectric constant gate insulating film located under the first insulating sidewall.

When the insulating sidewall includes the first insulating sidewall and the second insulating sidewall, the high dielectric constant gate insulating film may be continuously formed so as to extend from under the gate electrode to under the second insulating sidewall, and part of the high dielectric constant gate insulating film located under the second insulating sidewall may have a smaller thickness than a thickness of part of the high dielectric constant gate insulating film located under the first insulating sidewall.

In the semiconductor device of the present invention, the insulating sidewall may include a first insulating sidewall formed on a side surface of the gate electrode and a second insulating sidewall formed on the side surface of the gate electrode with the first insulating sidewall interposed therebetween, the high dielectric constant gate insulating film may be continuously formed so as to extend from under the gate electrode to under the second insulating sidewall, part of the high dielectric constant gate insulating film located under the first insulating sidewall may have the same thickness as a thickness of part of the high dielectric constant gate insulating film located under the gate electrode, and part of the high dielectric constant gate insulating film located under the second insulating sidewall may have a smaller thickness than a thickness of part of the high dielectric constant gate insulating film located under the gate electrode.

In the semiconductor device of the present invention, the high dielectric constant gate insulating film may include a notch at a side end portion.

The semiconductor device of the present invention may further include a buffer insulating film between the substrate and the high dielectric constant gate insulating film. In such a case, the buffer insulating film may be a silicon oxide film or a silicon oxynitride film.

In the semiconductor device of the present invention, the gate electrode may be a fully silicided gate electrode of which an entire region has been silicided.

A method for fabricating a semiconductor device according to the present invention includes the steps of: a) forming a high dielectric constant gate insulating film on an active region of a substrate; b) forming a gate electrode on the high dielectric constant gate insulating film; c) etching, after the step b), part of the high dielectric constant gate insulating film located in an external side to the gate electrode to reduce a thickness of the part; and d) forming, after the step c), an insulating sidewall on a side surface of the gate electrode.

The method for fabricating a semiconductor device according to the present invention may further include, after the step d), the step of removing part of the high dielectric constant gate insulating film located in an external side to the insulating sidewall.

In the method for fabricating a semiconductor device according to the present invention, the insulating sidewall may include a first insulating sidewall and a second insulating sidewall, and the step d) may include the step d1) of forming the first insulating sidewall on a side surface of the gate electrode and the step of d2) of forming the second insulating sidewall on the side surface of the gate electrode with the first insulating sidewall interposed therebetween.

When the step d) includes the step d1) and the step d2), the method for fabricating a semiconductor device according to the present invention may further include, between the step d) and the step d2), the step of removing part of the high dielectric constant gate insulating film located in the external side to the first insulating sidewall.

When the step d) includes the step d1) and the step d2), the method for fabricating a semiconductor device according to the present invention may further include, between d1) and the step d2), the step of etching part of the high dielectric gate insulating film located in an external side to the first insulating sidewall to reduce a thickness of the part; and after the step d2), the step of removing part of the high dielectric constant gate insulating film located in an external side to the second insulating sidewall.

In the method for fabricating a semiconductor device according to the present invention, the dielectric constant gate insulating film may be selectively removed by wet etching.

In the method for fabricating a semiconductor device according to the present invention, the step b) may include the step of forming a protective film for covering an upper surface of the gate electrode, and the method may further include, after the step d), the step of siliciding a surface of part of the active region located in the external side to the insulating sidewall, removing the protective film and then fully siliciding the gate electrode.

The method for fabricating a semiconductor device according to the present invention further includes, before the step a), the step of forming a buffer insulating film on the active region, and in the step a), the high dielectric constant gate insulating film may be formed on the active region with the buffer insulating film interposed therebetween.

According to the present invention, a high dielectric constant gate insulating film is continuously formed so as to extend from under a gate electrode to under a sidewall. In other words, continuity of the high dielectric constant gate insulating film at a gate end portion is maintained. Thus, reduction in the dielectric constant and insulation property of the high dielectric constant gate insulating film at the gate end portion, caused by a side end portion of the high dielectric constant gate insulating film being in direct contact with a sidewall film, can be suppressed. Moreover, the high dielectric constant gate insulating film is formed so as to have a smaller thickness in the part located under the sidewall than a thickness of the part located under gate electrode. Thus, increase in a capacitance between a gate and a drain can be suppressed, so that adverse effects on circuit speed can be reduced. Furthermore, since extension implantation or LDD implantation is performed through the part of the high dielectric constant film which has a small thickness, increase in implantation acceleration energy can be suppressed. Accordingly, a shallow junction can be formed in an extension or a LDD in a simple manner. Therefore, device characteristics can be improved in a simple manner.

As has been described, the present invention relates to a semiconductor device and a method for fabricating the semiconductor device. Specifically, when the present invention is applied to a MISFET including a high dielectric constant gate insulating film, the effect of improving the driving power and reliability of the MISFET can be achieved and is therefore very useful.

DESCRIPTION OF THE PREFERRED EMBODIMENTS (First Embodiment)

Figure 1:
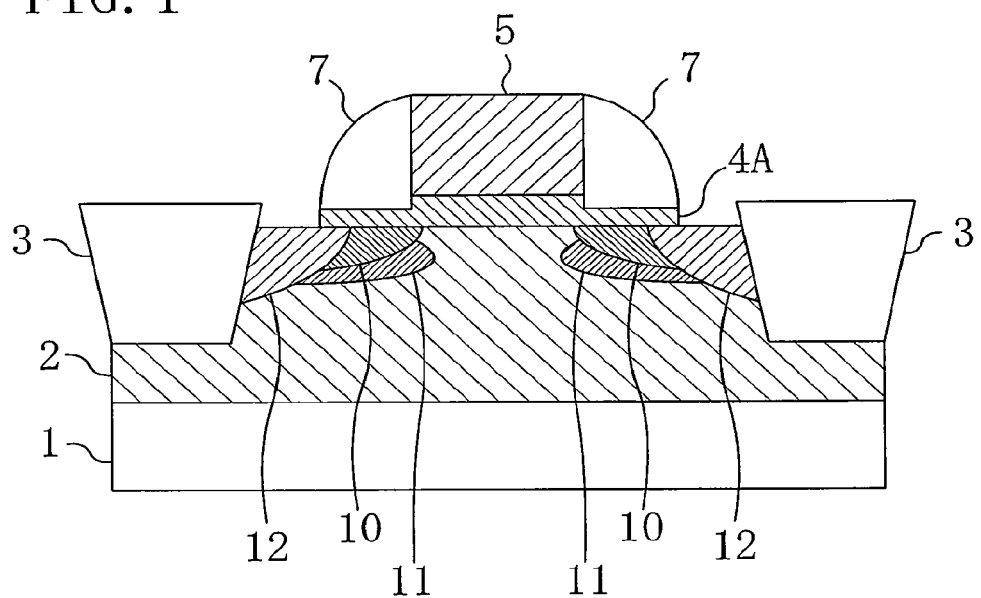
FIG. 1 is a cross-sectional view illustrating a structure of a semiconductor device according to a first embodiment of the present invention.

Hereafter, a semiconductor device according to a first embodiment of the present invention will be described with reference to the accompanying drawings. FIG. 1 is a cross-sectional view illustrating a structure of a semiconductor device (more specifically, a single sidewall type MISFET) according to the first embodiment. In this embodiment, description will be made using an n-type MISFET as an example. However, even when the present invention is applied to a p-type MISFET, the same effects as those of this embodiment can be achieved.

As shown in FIG. 1, a gate electrode 5 is formed on an active region of a p-type well 2 surrounded by a STI 3. The p-type well 2 is formed in a substrate 1 made of, for example, silicon. The gate electrode 5 is formed on the active region with a high dielectric constant gate insulating film 4A interposed therebetween. An insulating sidewall 7 is formed on each side surface of the gate electrode 5. An n-type extension region 10 is formed in part of the p-type well 2 located under the sidewall 7. Furthermore, a p-type pocket region 11 is formed in part of the p-type well 2 located under the n-type extension region 10. N-type source/drain regions 12 are formed so that each of the source/drain regions 12 is provided in part of the p-type well 2 located in the external side to the n-type extension region 10 and the p-type pocket region 11 when viewed from the gate electrode 5.

It is a first feature of this embodiment that the high dielectric constant gate insulating film 4A is kept remaining not only under the gate electrode 5 but also under the sidewall 7. That is, the high dielectric gate insulating film 4A is continuously formed so as to extend from under the gate electrode 5 to under the sidewall 7.

It is a second feature of this embodiment that the thickness of the part of the high dielectric constant gate insulating film 4A located under the sidewall 7 is smaller than a thickness of the part of the high dielectric constant film 4A located under the gate electrode 5. That is, the gate insulating film 4A is formed so as to have a convex shape.

According to this embodiment, each side end portion of the high dielectric constant gate insulating film 4A is not in contact with the sidewall 7 and continuity of the high dielectric constant gate insulating film 4A at an end portion of the gate electrode 5 is maintained. Accordingly, reduction in the dielectric constant and insulation property of the high dielectric constant gate insulating film 4A at the end portion of the gate electrode 5 can be suppressed, so that deterioration of device characteristics of the MISFET and reduction in the reliability of the gate insulating film can be prevented.

According to this embodiment, the existence of the high dielectric constant gate insulating film 4A under the sidewall 7 makes capacitive coupling between the gate electrode 5 and the n-type extension region 10 stronger in the vicinity of the end portion of the gate electrode 5. As a result, a high overlapping effect between a gate and a drain can be achieved (see T. Hori, IEDM Tech. Dig., 1989, p. 777). Therefore, device characteristics and hot carrier reliability can be improved at the same time.

Meanwhile, in this embodiment, because of the existence of the high dielectric constant gate insulating film 4A under the sidewall 7, there might be cases where a capacitance particularly between the gate electrode 5 and each of the n-type source/drain regions 12 is increased and, accordingly, a circuit speed is reduced. However, as described above, in this embodiment, the high dielectric constant gate insulating film 4A is formed so as to have a smaller thickness in the part located under the sidewall 7 than a thickness of the part located under the gate electrode 5. Therefore, increase in a capacitance between the gate and the drain and adverse effect on the circuit speed can be suppressed.

As has been described, according to this embodiment, device/circuit characteristics of an MISFET and the reliability of a gate insulating film, which are conventionally in the trade-off relationship, can be largely improved at the same time.

(Modified Example of First Embodiment)

Figure 6:
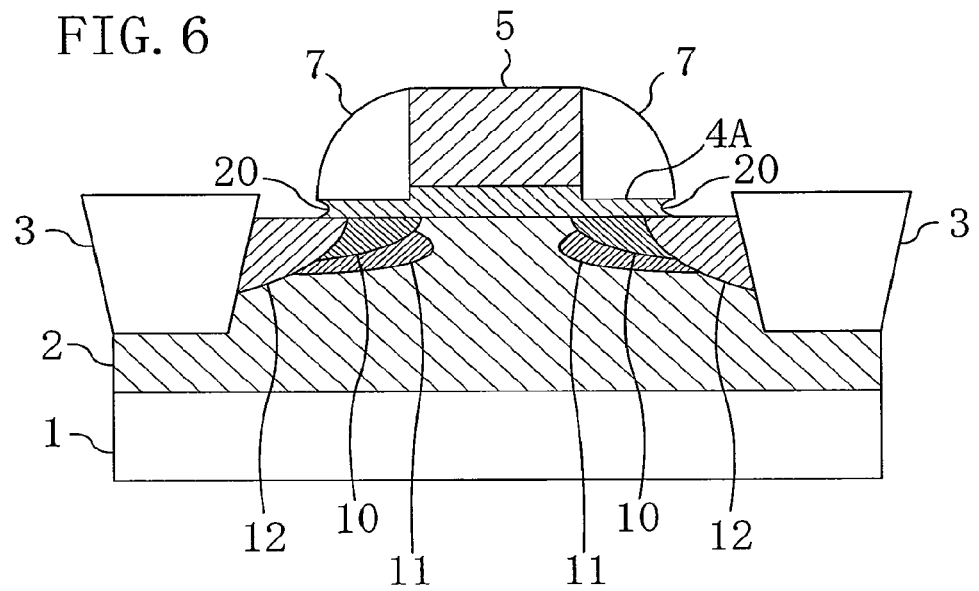
FIG. 6 is a cross-sectional view illustrating a structure of a semiconductor device according to a modified example of the first embodiment of the present invention.

Hereafter, a semiconductor device according to a modified example of the first embodiment of the present invention will be described with reference to the accompanying drawings. FIG. 6 is a cross-sectional view illustrating a structure of a semiconductor device (more specifically, a single sidewall n-type MISFET) according to the modified example of the first embodiment.

As shown in FIG. 6, this modified example is different from the first embodiment in that part of a high dielectric constant gate insulating film 4A located under each side end portion of a sidewall 7, i.e., a side portion of the high dielectric constant gate insulating film 4A is removed in a notch shape, so that a notch 20 is provided.

According to this modified example, adverse effects on circuit speed due to increase in a capacitance between a gate electrode 5 and each of n-type source/drain regions 12 can be further suppressed.

(Second Embodiment)

Hereafter, a semiconductor device according to a second embodiment of the present invention will be described with reference to the accompanying drawings. In contrast with the first embodiment in which a single sidewall type MISFET is described, a double sidewall type MISFET (see H. Sayama et al., IEDM Tech. Dig., 2000, p. 239) in which an overlapping amount between a gate electrode and an extension region can be optimized in a simple manner will be described in the second embodiment. In this embodiment, description will be made using an n-type MISFET as an example. However, even when the present invention is applied to a p-type MISFET, the same effects as those of this embodiment can be achieved.

Figure 2:
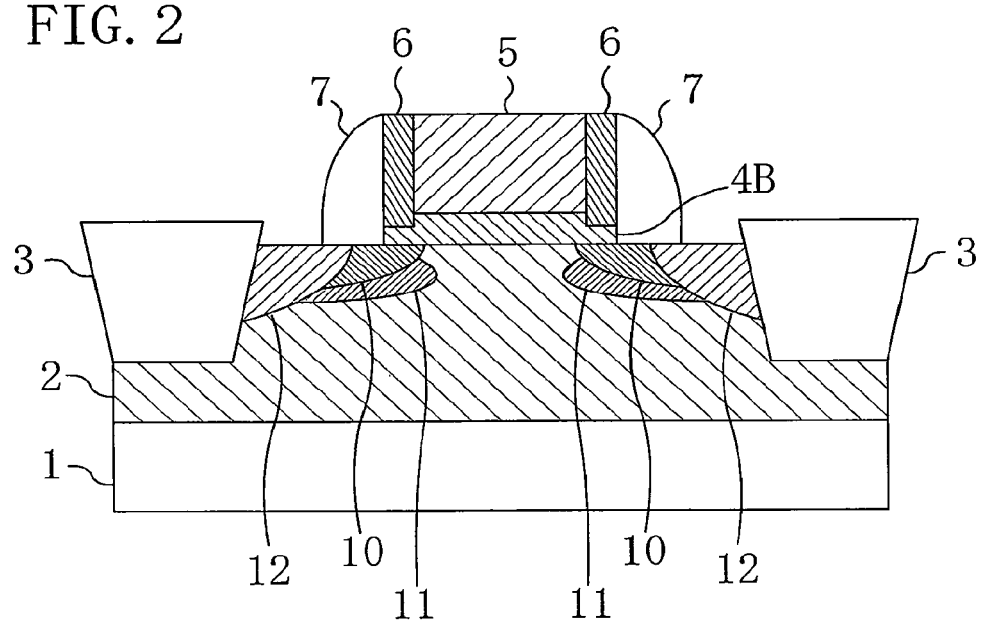
FIG. 2 is a cross-sectional view illustrating a structure of a semiconductor device according to a second embodiment of the present invention.

FIG. 2 is a cross-sectional view illustrating a structure of a semiconductor device according to the second embodiment. As shown in FIG. 2, a gate electrode 5 is formed on an active region of a p-type well 2 surrounded by a STI 3. The p-type well 2 is formed in a substrate 1 made of, for example, silicon. The gate electrode 5 is formed on the active region with a high dielectric constant gate insulating film 4B interposed therebetween. An insulating sidewall 7 is formed on each side surface of the gate electrode 5 with an offset sidewall 6 interposed therebetween. An n-type extension region 10 is formed in each of parts of the p-type well 2 located under the offset sidewall 6 and the sidewall 7. Furthermore, a p-type pocket region 11 is formed in part of the p-type well 2 located under the n-type extension region 10. N-type source/drain regions 12 are formed so that each of the source/drain regions is provided in part of the p-type well 2 located in the external side to the n-type extension region 10 and the p-type pocket region 11 when viewed from the gate electrode 5.

It is a first feature of this embodiment that the high dielectric constant gate insulating film 4B is kept remaining not only under the gate electrode 5 but also under the offset sidewall 6. That is, the high dielectric constant gate insulating film 4B is continuously formed so as to extend from under the gate electrode 5 to under the offset sidewall 6.

It is a second feature of this embodiment that the thickness of the part of the high dielectric constant gate insulating film 4B located under the offset sidewall 6 is smaller than a thickness of the part of the high dielectric constant film 4B located under the gate electrode 5. That is, the gate insulating film 4B is formed so as to have a convex shape.

According to this embodiment, each side end portion of the high dielectric constant gate insulating film 4B is not in contact with the offset sidewall 6 and continuity of the high dielectric constant gate insulating film 4B at an end portion of the gate electrode 5 is maintained. Accordingly, reduction in the dielectric constant and insulation property of the high dielectric constant gate insulating film 4B at the end portion of the gate electrode 5 can be suppressed, so that deterioration of device characteristics of the MISFET and reduction in the reliability of the gate insulating film can be prevented.

According to this embodiment, the existence of the high dielectric constant gate insulating film 4B under the offset sidewall 6 makes capacitive coupling between the gate electrode 5 and the n-type extension region 10 stronger in the vicinity of the end portion of the gate electrode 5. As a result, a high overlapping effect between a gate and a drain can be achieved (see T. Hori, IEDM Tech. Dig., 1989, p. 777). Therefore, device characteristics and hot carrier reliability can be improved at the same time.

Moreover, according to this embodiment, the high dielectric constant gate insulating film 4B does not exist under the sidewall 7. Thus, increase in a capacitance between the gate electrode 5 and each of the n-type source/drain regions 12 can be further suppressed so that a small capacitance can be maintained. Accordingly, increase in a parasitic capacitance and adverse effects on circuit speed due to the increase can be suppressed at a minimum level.

As has been described, according to this embodiment, device/circuit characteristics of an MISFET and the reliability of a gate insulating film, which are conventionally in the trade-off relationship, can be largely improved at the same time.

(First Modified Example of Second Embodiment)

Figure 7:
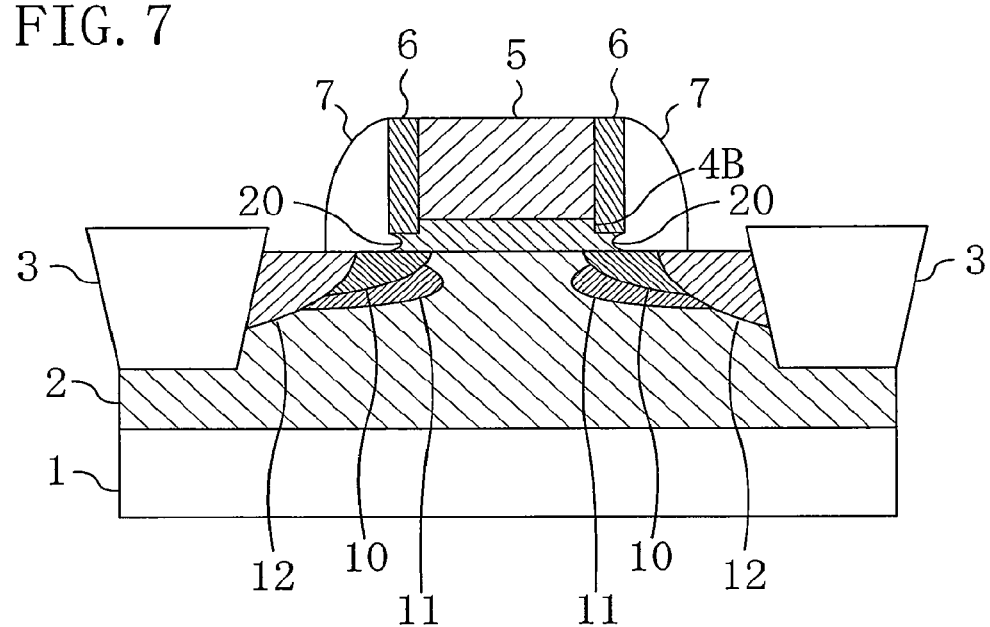
FIG. 7 is a cross-sectional view illustrating a structure of a semiconductor device according to a first modified example of the second embodiment of the present invention.

Hereafter, a semiconductor device according to a modified example of the second embodiment of the present invention will be described with reference to the accompanying drawings. FIG. 7 is a cross-sectional view illustrating a structure of the semiconductor device (more specifically, a double sidewall type MISFET) according to the first modified example of the second embodiment.

As shown in FIG. 7, this modified example is different from the second embodiment is that part of a high dielectric constant gate insulating film 4B located under each side end portion of the offset sidewall 6, i.e., a side portion of the high dielectric constant gate insulating film 4B is removed in a notch shape, so that a notch 20 is provided.

According to this modified example, adverse effects on circuit speed due to increase in a capacitance between a gate electrode 5 and each of n-type source/drain regions 12 can be further suppressed.

(Second Modified Example of Second Embodiment)

Figure 3:
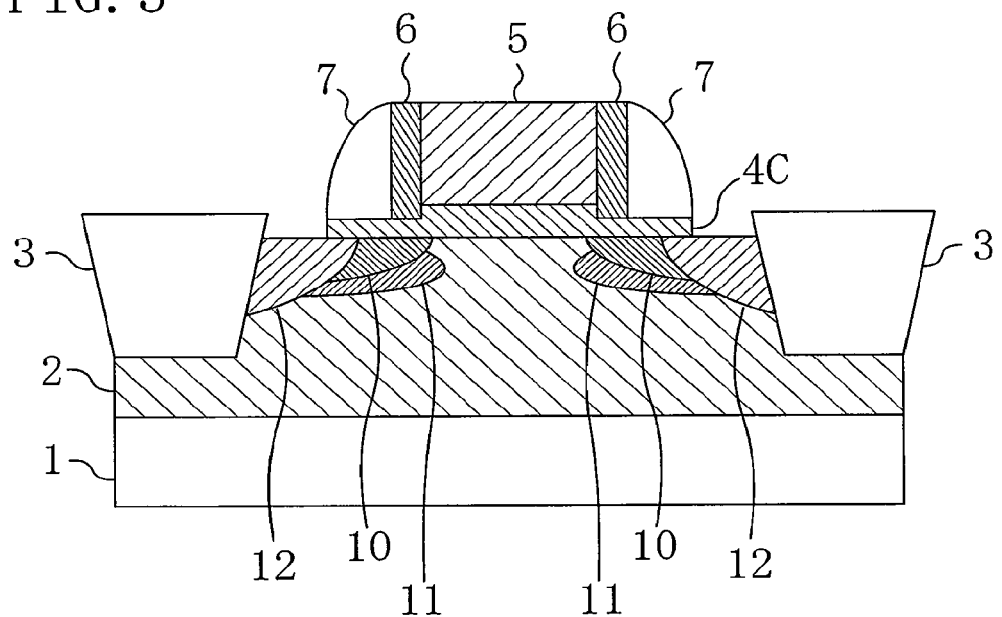
FIG. 3 is a cross-sectional view illustrating a structure of a semiconductor device according to a second modified example of the second embodiment of the present invention.

Hereafter, a semiconductor device according to a second modified example of the second embodiment of the present invention will be described with reference to the accompanying drawings. FIG. 3 is a cross-sectional view illustrating a structure of the semiconductor device (more specifically, a double sidewall type MISFET) according to the second modified example of the second embodiment.

This embodiment is different from the second embodiment in that a high dielectric constant gate insulating film 4C is kept remaining not only under the gate electrode 5 and the offset sidewall 6 but also under the sidewall 7. That is, the high dielectric constant gate insulating film 4C is continuously formed so as to extend from under the gate electrode 5 to under the sidewall 7.

In this modified example, the thickness of part of the high dielectric constant gate insulating film 4C located under the sidewall 7 is the same as the thickness of part of the high dielectric constant gate insulating film 4C located under the offset sidewall 6. That is, the high dielectric constant gate insulating film 4C is formed so as to have a convex shape.

According to this modified embodiment, the high dielectric constant gate insulating film 4C is continuously formed so as to extend from under the gate electrode 5 to under the sidewall 7. Thus, even when the offset sidewall 6 has a very small width (thickness), each side end portion of the high dielectric constant gate insulating film 4C is not in contact with the sidewall 7 and continuity of the high dielectric constant gate insulating film 4C at an end portion of the gate electrode 5 is maintained. Accordingly, reduction in the dielectric constant and insulation property of the high dielectric constant gate insulating film 4C at the end portion of the gate electrode 5 can be suppressed, so that deterioration of device characteristics of the MISFET and reduction in the reliability of the gate insulating film can be prevented.

In this modified example, as in the first embodiment, because of the existence of the high dielectric constant gate insulating film 4C under sidewall 7, there might be cases where a capacitance between the gate electrode 5 and each of the n-type source/drain regions 12 is increased. However, as has been described, in this modified example, the high dielectric constant gate insulating film 4C is formed so as to have a smaller thickness in the part located under the sidewall 7 than a thickness of the part located under the gate electrode 5. Therefore, increase in a parasitic capacitance and adverse effects on circuit speed due to the increase can be suppressed.

(Third Modified Example of Second Embodiment)

Figure 4:
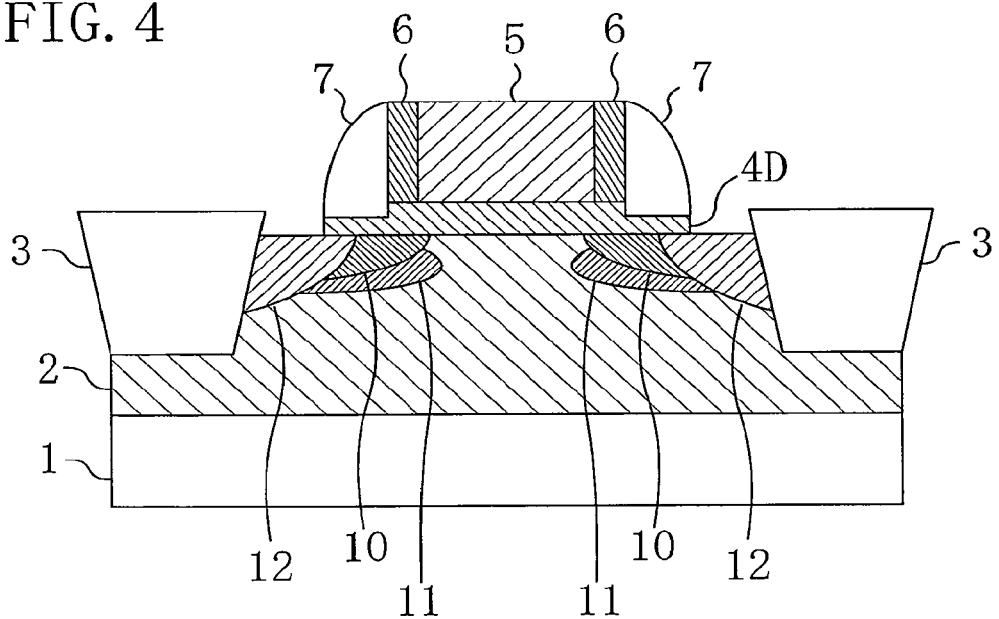
FIG. 4 is a cross-sectional view illustrating a structure of a semiconductor device according to a third modified example of the second embodiment of the present invention.

Hereafter, a semiconductor device according to a third modified example of the second embodiment of the present invention will be described with reference to the accompanying drawings. FIG. 4 is a cross-sectional view illustrating a structure of a semiconductor device (more specifically, a double sidewall type MISFET) according to the third modified example of the second embodiment.

A first difference between this modified example and the second embodiment is that in this modified example, a high dielectric constant gate insulating film 4D is kept remaining not only under the gate electrode 5 and the offset sidewall 6 but also under the sidewall 7. That is, the high dielectric constant gate insulating film 4D is continuously formed so as to extend from under the gate electrode 5 to under the sidewall 7.

A second difference between this modified example and the second embodiment is that in this modified example, the thickness of part of the high dielectric constant gate insulating film 4D located under the offset sidewall 6 is the same as the thickness of part of the high dielectric constant gate insulating film 4D located under the gate electrode 5. The thickness of part of the high dielectric constant gate insulating film 4D located under the sidewall 7 is smaller than the thickness of the part of the high dielectric constant gate insulating film 4D located under the gate electrode 5. That is, the high dielectric constant gate insulating film 4D is formed so as to have a convex shape.

According to this modified example, the high dielectric constant gate insulating film 4D is continuously formed so as to extend from under the gate electrode 5 to under the sidewall 7. Thus, even when the offset sidewall 6 has a very small width (thickness), each side end portion of the high dielectric constant gate insulating film 4D is not in contact with the sidewall 7 and continuity of the high dielectric constant gate insulating film 4D at an end portion of the gate electrode 5 is maintained. Accordingly, reduction in the dielectric constant and insulation property of the high dielectric constant gate insulating film 4D at the end portion of the gate electrode 5 can be suppressed, so that deterioration of device characteristics of the MISFET and reduction in the reliability of the gate insulating film can be prevented.

In this modified example, as in the first embodiment, because of the existence of the high dielectric constant gate insulating film 4D under sidewall 7, there might be cases where a capacitance between the gate electrode 5 and each of the n-type source/drain regions 12 is increased. However, as has been described, in this modified example, the high dielectric constant gate insulating film 4D is formed so as to have a smaller thickness in the part located under the sidewall 7 than a thickness of the part located under the gate electrode 5. Therefore, increase in a parasitic capacitance and adverse effects on circuit speed due to the increase can be suppressed.

(Third Embodiment)

Hereafter, a semiconductor device according to a third embodiment of the present invention will be described with reference to the accompanying drawings. In contrast with the first embodiment in which a single sidewall type MISFET is described, a double sidewall type MISFET (see H. Sayama et al., IEDM Tech. Dig., 2000, p. 239) in which an overlapping amount between a gate electrode and an extension region can be optimized in a simple manner will be described in the third embodiment. In this embodiment, description will be made using an n-type MISFET as an example. However, even when the present invention is applied to a p-type MISFET, the same effects as those of this embodiment can be achieved.

Figure 5:
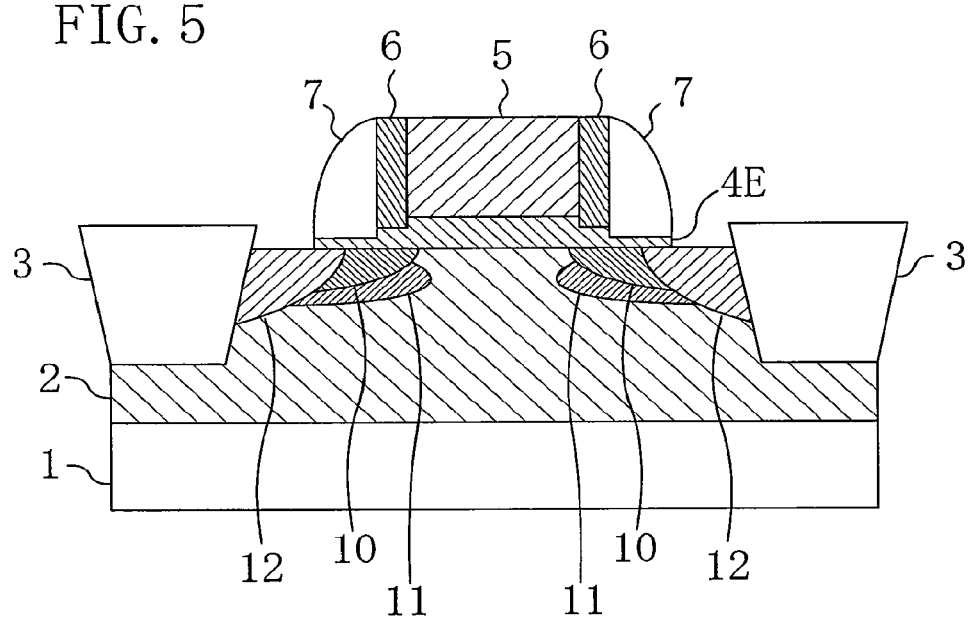
FIG. 5 is a cross-sectional view illustrating a structure of a semiconductor device according to a third embodiment of the present invention.

FIG. 5 is a cross-sectional view illustrating a structure of a semiconductor device according to the third embodiment. As shown in FIG. 5, a gate electrode 5 is formed on an active region of a p-type well 2 surrounded by a STI 3. The p-type well 2 is formed in a substrate 1 made of, for example, silicon. The gate electrode 5 is formed on the active region with a high dielectric constant gate insulating film 4E interposed therebetween. An insulating sidewall 7 is formed on each side surface of the gate electrode 5 with an offset sidewall 6 interposed therebetween. An n-type extension region 10 is formed in each of parts of the p-type well 2 located under the offset sidewall 6 and the sidewall 7. Furthermore, a p-type pocket region 11 is formed in part of the p-type well 2 located under the n-type extension region 10. N-type source/drain regions 12 are formed so that each of the source/drain is provided in part of the p-type well 2 located in the external side to the n-type extension region 10 and the p-type pocket region 11 when viewed from the gate electrode 5.

It is a first feature that the high dielectric constant gate insulating film 4E is kept remaining not only under the gate electrode 5 and but also under each of the offset sidewall 6 and the sidewall 7. That is, the high dielectric constant gate insulating film 4E is continuously formed so as to extend from under the gate electrode 5 to under the sidewall 7.

It is a second feature of this embodiment that the thickness of the part of the high dielectric constant gate insulating film 4E located under the offset sidewall 6 is smaller than a thickness of the part of the high dielectric constant film 4E located under the gate electrode 5 and the thickness of the high dielectric constant gate insulating film 4E located under the sidewall 7 is smaller than the thickness of the part of the high dielectric constant film 4E located under the offset sidewall 6. That is, the gate insulating film 4E is formed so as to have a double convex shape.

According to this embodiment, the high dielectric constant gate insulating film 4E is continuously formed so as to extend from under the gate electrode 5 to under the sidewall 7. Thus, even when the offset sidewall 6 has a very small width (thickness), each side end portion of the high dielectric constant gate insulating film 4E is not in contact with the sidewall 7 and continuity of the high dielectric constant gate insulating film 4E at an end portion of the gate electrode 5 is maintained. Accordingly, reduction in the dielectric constant and insulation property of the high dielectric constant gate insulating film 4E at the end portion of the gate electrode 5 can be suppressed, so that deterioration of device characteristics of the MISFET and reduction in the reliability of the gate insulating film can be prevented.

According to this embodiment, the existence of the high dielectric constant gate insulating film 4E under the offset sidewall 6 makes capacitive coupling between the gate electrode 5 and the n-type extension region 10 stronger at the vicinity of the end portion of the gate electrode 5. As a result, a high overlapping effect between a gate and a drain can be achieved (see T. Hori, IEDM Tech. Dig., 1989, p. 777). Therefore, device characteristics and hot carrier reliability can be improved at the same time.

As in the first embodiment, in this embodiment, because of the existence of the high dielectric constant gate insulating film 4E under sidewall 7, there might be cases where a capacitance between the gate electrode 5 and each of the n-type source/drain regions 12 is increased and, accordingly, a circuit speed is reduced. However, as has been described, in this embodiment, the high dielectric constant gate insulating film 4E is formed so that the thickness of the high dielectric constant gate insulating film 4E is reduced in the part located under the offset sidewall 6 and then is further reduced in the part located under the sidewall 7. Therefore, increase in a parasitic capacitance and adverse effects on circuit speed due to the increase can be suppressed so that the parasitic capacitance is a very low level.

As has been described, according to this embodiment, device/circuit characteristics of an MISFET and the reliability of a gate insulating film, which are conventionally in the trade-off relationship, can be largely improved at the same time.

(Modified Example of Third Embodiment)

Figure 8:
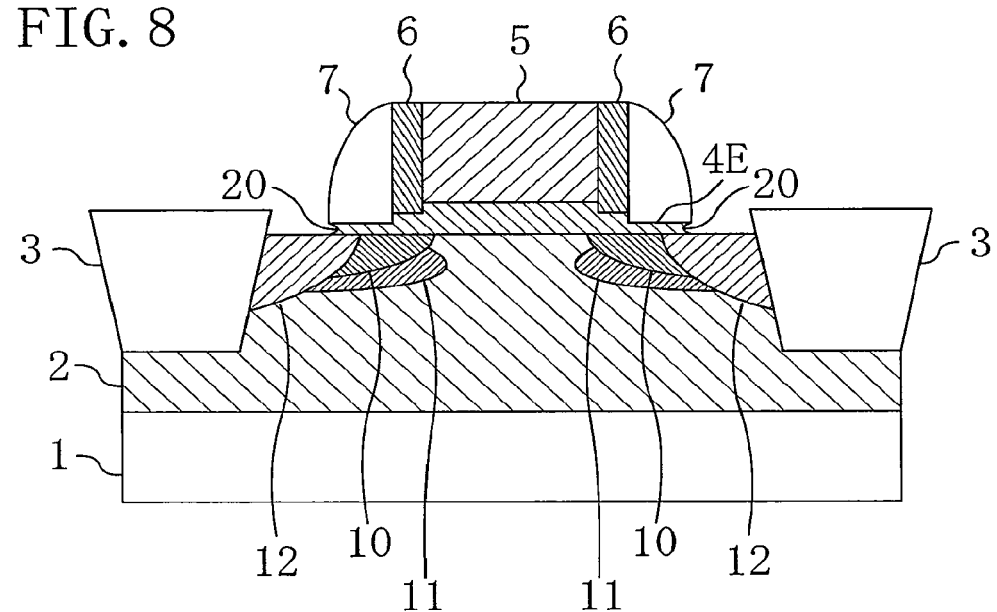
FIG. 8 is a cross-sectional view illustrating a structure of a semiconductor device according to a modified example of the third embodiment of the present invention.

Hereafter, a semiconductor device according to a modified example of a third embodiment of the present invention will be described with reference to the accompanying drawings. FIG. 8 is a cross-sectional view illustrating a structure of a semiconductor device (more specifically, a double sidewall type MISFET) according to the modified example of the third embodiment.

As shown in FIG. 8, this modified example is different from the first embodiment in that part of a high dielectric constant gate insulating film 4E located under each side end portion of a sidewall 7, i.e., a side portion of the high dielectric constant gate insulating film 4E is removed in a notch shape, so that a notch 20 is provided.

According to this modified example, adverse effects on circuit speed due to increase in a capacitance between a gate electrode 5 and each of n-type source/drain regions 12 can be further suppressed.

(Fourth Embodiment)

Figure 9:
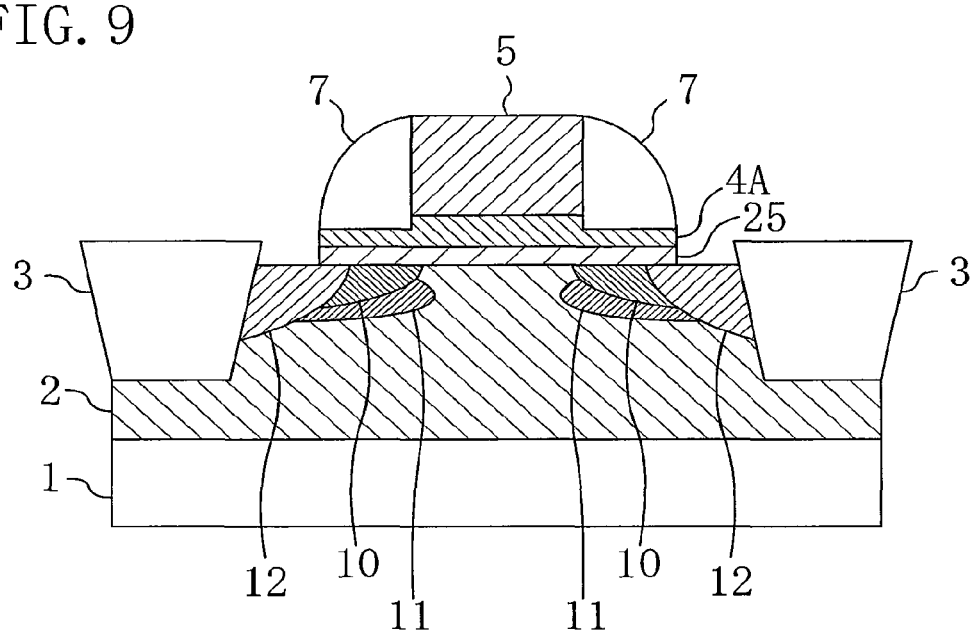
FIG. 9 is a cross-sectional view illustrating a structure of a semiconductor device according to a fourth embodiment of the present invention.

Hereafter, a semiconductor device according to a fourth embodiment of the present invention will be described with reference to the accompanying drawings. FIG. 9 is a cross-sectional view illustrating a structure of a semiconductor device (more specifically, a single sidewall type MISFET) according to the fourth embodiment of the present invention. In this embodiment description will be made using an n-type MISFET as an example. However, even when the present invention is applied to a p-type MISFET, the same effects as those of this embodiment can be achieved.

As shown in FIG. 9, this embodiment is different from the first embodiment in that, for example, a silicon oxide film, a silicon oxynitride film or the like is provided as a buffer insulating film 25 between a substrate 1 and a high dielectric constant gate insulating film 4A.

According to this embodiment, in addition to the effects of the first embodiment, an interface between a substrate and a gate insulating film can be advantageously kept in a normal state. Specifically, by forming the high dielectric constant gate insulating film 4A on the substrate 1 with the buffer insulating film 25 interposed therebetween, deterioration of an interface between a substrate and a gate insulating film can be suppressed, compared to the case where the high dielectric constant gate insulating film 4A is formed directly on the substrate 1.

In this embodiment, the buffer insulating film 25 is provided between the high dielectric constant gate insulating film 4A of the first embodiment and the substrate 1. However, instead of this structure, even if the buffer insulating film 25 is provided between the substrate 1 and the high dielectric constant gate insulating film 4B of the second embodiment, the high dielectric constant gate insulating film 4C of the second modified example of the second embodiment, the high dielectric constant gate insulating film 4D of the third modified example of the second embodiment or the high dielectric constant gate insulating film 4E of the third embodiment, the same effects as those of this embodiment can be achieved. Moreover, instead of providing the buffer insulating film 25 between the substrate 1 and the high dielectric constant gate insulating film 4A, 4B, 4C, 4D or 4E, a buffer insulating film may be provided between the gate electrode 5 and the high dielectric constant gate insulating film 4A, 4B, 4C, 4D or 4E. With such a structure, compared to the case where the gate electrode 5 is directly formed on the high dielectric constant gate insulating film 4A, 4B, 4C, 4D or 4E, deterioration of an interface between a gate electrode and a gate insulating film can be prevented. As another alternative, a buffer insulating film may be formed between the gate electrode 5 and the high dielectric constant gate insulating film 4A, 4B, 4C, 4D or 4E as well as forming the buffer insulating film 25 between the substrate 1 and the high dielectric constant gate insulating film 4A, 4B, 4C, 4D or 4E. With such a structure, deterioration of each of the substrate-gate insulating film interface and the gate insulating film-gate electrode interface can be prevented at the same time.

(Modified Example of Fourth Embodiment)

Figure 10:
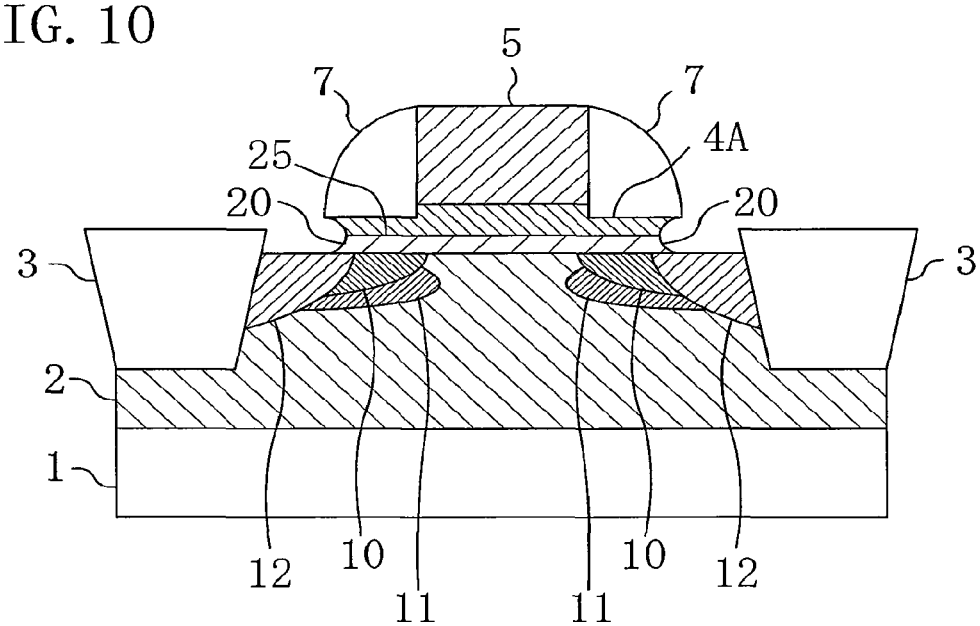
FIG. 10 is a cross-sectional view illustrating a structure of a semiconductor device according to a modified example of the fourth embodiment of the present invention.

Hereafter, a semiconductor device according to a modified example of the fourth embodiment of the present invention will be described with reference to the accompanying drawings. FIG. 10 is a cross-sectional view illustrating a structure of a semiconductor device (more specifically, a single sidewall type MISFET) according to the modified example of the fourth embodiment.

As shown in FIG. 10, this modified example is different from the fourth embodiment in that part of a laminated insulating film of a high dielectric constant gate insulating film 4A and a buffer insulating film 25 located under a side end portion of each sidewall 7, i.e., a side end portion of the laminated insulating film is removed in a notch shape, so that a notch 20 is provided.

According to this modified example, adverse effects on circuit speed due to increase in a capacitance between a gate electrode 5 and each of n-type source/drain regions 12 can be further suppressed.

In this modified example, the notch 20 is provided in the side end portion of the laminated insulating film of the high dielectric constant gate insulating film 4A and the buffer insulating film 25 of the first embodiment. However, instead of this structure, even if a notch is provided in a side end portion of a laminated insulating film of the buffer insulating film 25 and the high dielectric constant gate insulating film 4B of the second embodiment, the high dielectric constant gate insulating film 4C of the second modified example of the second embodiment, the high dielectric constant gate insulating film 4D of the third modified example of the second embodiment or the high dielectric constant gate insulating film 4E of the third embodiment, the same effects of the modified example can be achieved. In such cases, a buffer insulating film may be provided between the gate electrode 5 and the high dielectric constant gate insulating film 4A, 4B, 4C, 4D or 4D as well as forming the buffer insulating film 25 between the substrate 1 and the high dielectric constant gate insulating film 4A, 4B, 4C, 4D or 4D.

(Fifth Embodiment)

Hereafter, a method for fabricating a semiconductor device according to a fifth embodiment of the present invention will be described with reference to the accompanying drawings. In this embodiment, description will be made using a method for fabricating an n-type MISFET as an example. FIGS. 11A through 11F are cross-sectional views illustrating respective steps for fabricating a semiconductor device according to the fifth embodiment.

Figure 11A:
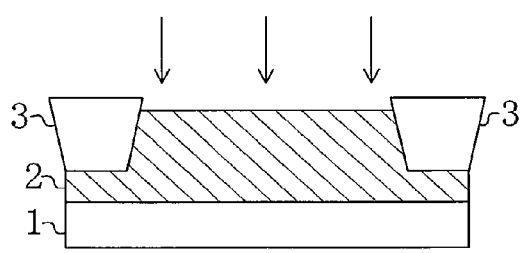
FIGS. 11A through 11F are cross-sectional views illustrating respective steps for fabricating a semiconductor device according to a fifth embodiment of the present invention.

First, as shown in FIG. 11A, a STI 3 which is to be an isolation region is selectively formed on a substrate 1 of, for example, silicon and then, for example, B (boron) is ion implanted into the substrate 1 at an implantation energy of 300 keV and a dose of $1 \times 10^{13}$ cm$^{-2}$. Thus, a p-type well 2 which is to be an active region is formed. Subsequently, ion implantation (of B at an implantation energy of 150 keV and a dose of $1 \times 10^{13}$ cm$^{-2}$) for punch-through stopper formation and ion implantation (of B at an implantation energy of 20 keV and a dose of $5 \times 10^{12}$ cm$^{-2}$) for channel formation are performed.

Figure 11D:
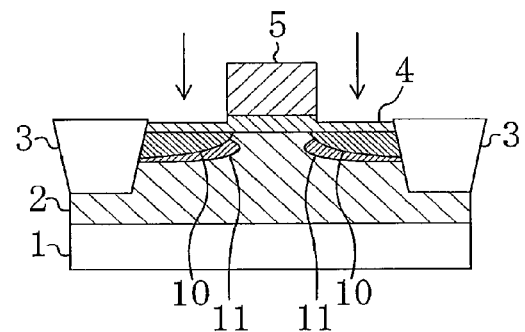
Figure 11B:
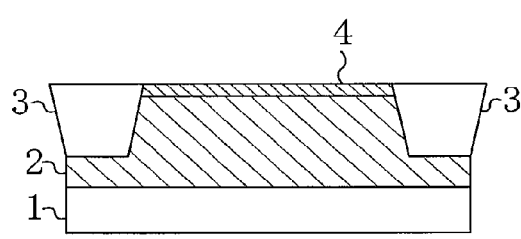

Next, as shown in FIG. 11B, as a buffer insulating film, for example, a silicon oxide film (not shown) is formed on the active region of the p-type well 2 surrounded by the STI 3 so as to have a thickness of about 0.5 nm and then, as a high dielectric constant film 4, for example, a HfSiON film is deposited thereon to a thickness of about 4 nm (i.e., about 1 nm in terms of an equivalent oxide thickness).

Figure 11E:
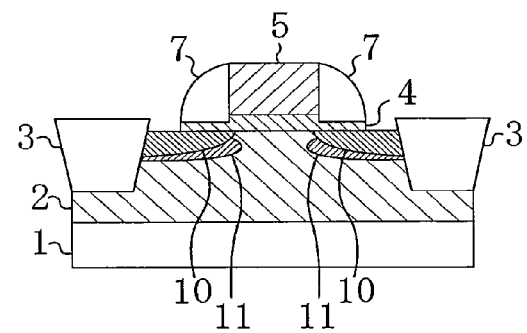
Figure 11C:
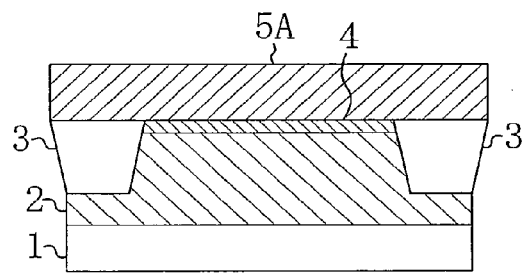

Next, as shown in FIG. 11C, for example, a gate electrode material film 5A is formed on the high dielectric constant gate insulating film 4 so as to have a thickness of about 100 nm.

Next, a resist pattern (not shown) is formed on the gate electrode material film 5A so as to cover a gate electrode formation region, and then the gate electrode material film 5A is etched using the resist pattern as a mask, thereby forming, as shown in FIG. 11D, a gate electrode 5. Thereafter, part of the high dielectric constant gate insulating film 4 located in the external side to the gate electrode 5 is removed by a thickness of about 2 nm by selective etching. Thus, a thickness of part of the high dielectric constant gate insulating film 4 located in the external side to the gate electrode 5 can be reduced so that a remaining thickness of the part of the high dielectric constant gate insulating film 4 becomes about 2 nm. Subsequently, using the gate electrode 5 as a mask, for example, As (arsenic) is ion implanted into the substrate 1 at an implantation energy of 2 keV and a dose of $1 \times 10^{15}$ cm$^{-2}$, thereby forming an n-type extension region 10. Thereafter, using the gate electrode 5 as a mask, for example, B is ion implanted into the substrate 1 at an implantation energy of 10 keV and a dose of $3 \times 10^{13}$ cm$^{-2}$, thereby forming a p-type pocket region 11. In this case, the n-type extension region 10 may be formed after forming the p-type pocket region 11.

Next, an insulating film is deposited over the substrate 1 to a thickness of about 50 nm, and then the insulating film is etched back to form, as shown in FIG. 11E, an insulating sidewall 7 on each side surface of the gate electrode 5.

Figure 11F:
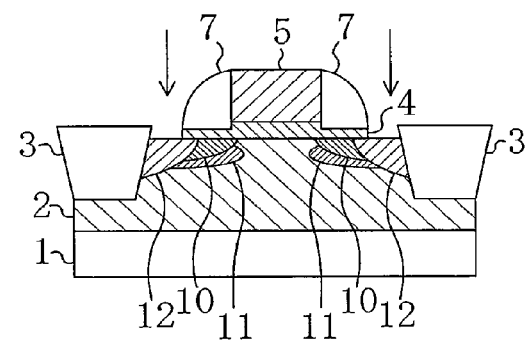

Next, using the gate electrode 5 and the sidewall 7 as a mask, for example, As is ion implanted into the substrate 1 at an implantation energy of 10 keV and a dose of $5 \times 10^{15}$ cm$^{-2}$, and then, for example, spike RTA (rapid thermal annealing) is performed at a temperature of about 1050° C., thereby activating the implanted impurity. Thus, as shown in FIG. 11F, n-type source/drain regions 12 are formed.

According to the above-described fabrication method of this embodiment, the MISFET structure (see FIG. 1) of the first embodiment can be realized in a relatively simple manner.

Meanwhile, the high dielectric constant gate insulating film 4 contains heavy metal and thus Rp (projection range) of implanted ions passing through the high dielectric constant gate insulating film 4 tends to be small. Therefore, in the process step of FIG. 11D, if without reducing the thickness of the high dielectric constant gate insulating film 4, ion implantation is performed to the substrate 1 covered with the high dielectric constant gate insulating film 4 in the external side to the gate electrode 5 to form the n-type extension region 10 or the p-type pocket region 11, an acceleration energy has to be increased. However, in this embodiment, the part of the high dielectric constant gate insulating film 4 located in the external side to the gate electrode 5 has a reduced thickness, so that increase in acceleration energy can be suppressed. Accordingly, a shallow junction can be formed in the n-type extension region 10 in a simple manner and thus device characteristics can be improved in a simple manner.

In this embodiment, after the sidewall 7 has been formed, for example, part of the high dielectric constant gate insulating film 4 located in the external side to the sidewall 7 may be removed by wet etching using hydrofluoric acid or the like or selective dry etching. In such a case, when wet etching is used, part of the high dielectric constant gate insulating film 4 located under each side end portion of the sidewall 7, i.e., a side end portion of the high dielectric constant gate insulating film 4 may be removed in a notch shape, so that a notch is formed. Thus, the MISFET structure (see FIG. 6) of the modified example of the first embodiment can be realized in a simple manner.

In this embodiment, a target thickness for reduction in the thickness of the part of the high dielectric constant gate insulating film 4 located in the external side to the gate electrode 5 is not particularly limited. However, for example, when an HfSiON film is used as the high dielectric constant gate insulating film 4, to suppress increase in a capacitance between a gate and a grain, the thickness of part of the high dielectric constant gate insulating film 4 located in the external side to the gate electrode 5 is preferably reduced to about 2 nm or less (so that a surface of the substrate 1 is not exposed).

(Sixth Embodiment)

Hereafter, a method for fabricating a semiconductor device according to a sixth embodiment of the present invention will be described with reference to the accompanying drawings. In this embodiment, description will be made using a method for fabricating an n-type MISFET as an example. FIGS. 12A through 12G are cross-sectional views illustrating respective steps for fabricating a semiconductor device according to the sixth embodiment.

Figure 12A:
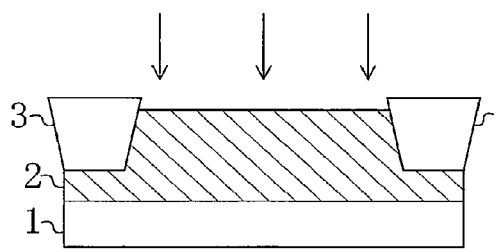
FIGS. 12A through 12G are cross-sectional views illustrating respective steps for fabricating a semiconductor device according to a sixth embodiment of the present invention.

First, as shown in FIG. 12A, a STI 3 which is to be an isolation region is selectively formed on a substrate 1 of, for example, silicon and then, for example, B is ion implanted into the substrate 1 at an implantation energy of 300 keV and a dose of $1 \times 10^{13}$ cm$^{-2}$. Thus, a p-type well 2 which is to be an active region is formed. Subsequently, ion implantation (of B at an implantation energy of 150 keV and a dose of $1 \times 10^{13}$ cm$^{-2}$) for punch-through stopper formation and ion implantation (of B at an implantation energy of 20 keV and a dose of $5 \times 10^{12}$ cm$^{-2}$) for channel formation are performed.

Figure 12B:
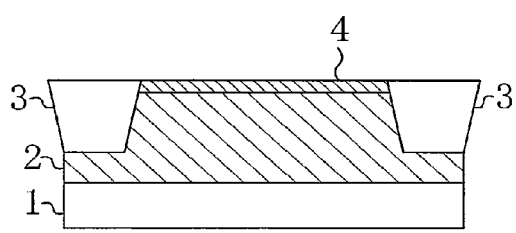

Next, as shown in FIG. 12B, as a buffer insulating film, for example, a silicon oxide film (not shown) is formed on the active region of the p-type well 2 surrounded by the STI 3 so as to have a thickness of about 0.5 nm and then, as a high dielectric constant film 4, for example, a HfSiON film is deposited thereon to a thickness of about 4 nm (i.e., about 1 nm in terms of an equivalent oxide thickness).

Figure 12C:
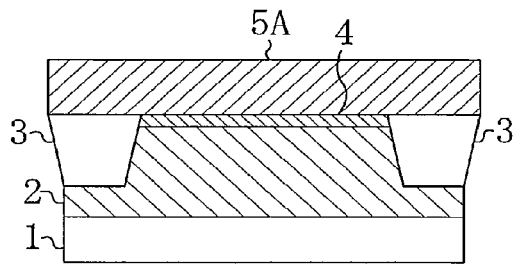

Next, as shown in FIG. 12C, for example, a gate electrode material film 5A is formed on the high dielectric constant gate insulating film 4 so as to have a thickness of about 100 nm.

Figure 12D:
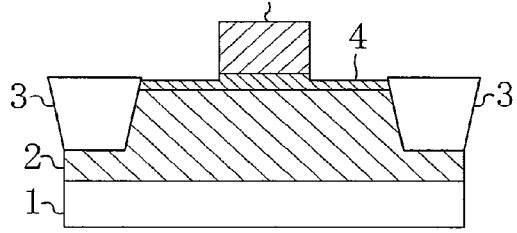

Next, a resist pattern (not shown) is formed on the gate electrode material film 5A so as to cover a gate electrode formation region, and then the gate electrode material film 5A is etched using the resist pattern as a mask, thereby forming, as shown in FIG. 12D, a gate electrode 5. Thereafter, part of the high dielectric constant gate insulating film 4 located in the external side to the gate electrode 5 is removed by a thickness of about 2 nm by selective etching. Thus, a thickness of the part of the high dielectric constant gate insulating film 4 located in the external side to the gate electrode 5 can be reduced so that a remaining thickness of the part of the high dielectric constant gate insulating film 4 becomes about 2 nm.

Figure 12E:
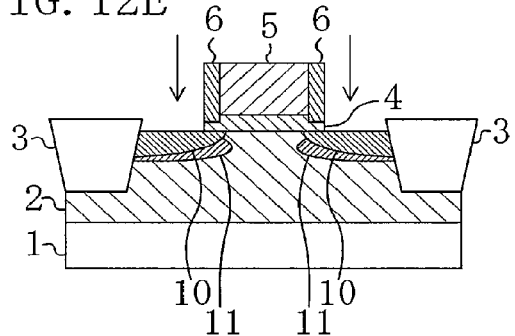

Next, an insulating film is deposited over the substrate 1 to a thickness of about 10 nm, and then the insulating film is etched back to form, as shown in FIG. 12E, an insulating offset sidewall 6 on each side surface of the gate electrode 5. Thereafter, part of the high dielectric constant gate insulating film 4 located in the external side to the offset sidewall 6 is removed by wet etching using, for example, hydrofluoric acid or selective dry etching. Subsequently, using the gate electrode 5 and the offset sidewall 6 as a mask, for example, As is ion implanted into the substrate 1 at an implantation energy of 2 keV and a dose of $1\times10^{15}$ cm$^{-2}$, thereby forming an n-type extension region 10. Thereafter, using the gate electrode 5 and the offset sidewall 6 as a mask, for example, B is ion implanted into the substrate 1 at an implantation energy of 10 keV and a dose of $3\times10^{13}$ cm$^{-2}$, thereby forming a p-type pocket region 11.

Figure 12F:
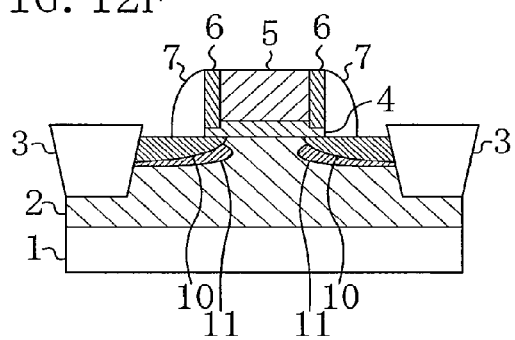

Next, an insulating film is deposited over the substrate 1 to a thickness of about 50 nm, and then the insulating film is etched back to form, as shown in FIG. 12F, an insulating sidewall 7 on each side surface of the gate electrode 5 with the offset sidewall 6 interposed therebetween.

Figure 12G:
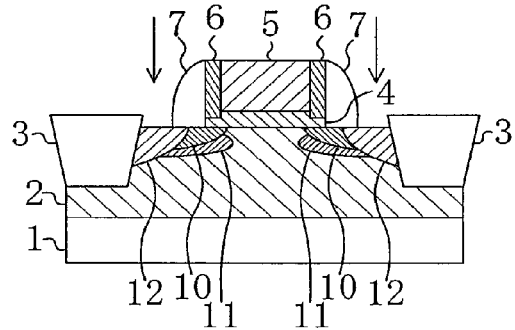

Next, using the gate electrode 5, the offset sidewall 6 and the sidewall 7 as a mask, for example, As is ion implanted into the substrate 1 at an implantation energy of 10 keV and a dose of $5\times10^{15}$ cm$^{-2}$, and then, for example, spike RTA (rapid thermal annealing) is performed at a temperature of about 1050° C., thereby activating the implanted impurity. Thus, as shown in FIG. 12G, n-type source/drain regions 12 are formed.

According to the above-described fabrication method of this embodiment, the MISFET structure (see FIG. 2) of the second embodiment can be realized in a relatively simple manner.

In this embodiment, after the offset sidewall 6 has been formed, part of the high dielectric constant gate insulating film 4 located in the external side to the offset sidewall 6 is removed, for example, by wet etching using hydrofluoric acid or the like. When this wet etching is performed, part of the high dielectric constant gate insulating film 4 located under each side end portion of the offset sidewall 6, i.e., a side end portion of the high dielectric constant gate insulating film 4 may be removed in a notch shape, so that a notch is formed. Thus, the MISFET structure (see FIG. 7) of the first modified example of the second embodiment can be realized in a simple manner.

In this embodiment, a target thickness for reduction in the thickness of the part of the high dielectric constant gate insulating film 4 located in the external side to the gate electrode 5 is not particularly limited. However, for example, when an HfSiON film is used as the high dielectric constant gate insulating film 4, to suppress increase in a capacitance between a gate and a grain, the thickness of part of the high dielectric constant gate insulating film 4 located in the external side to the gate electrode 5 is preferably reduced to about 2 nm or less (so that a surface of the substrate 1 is not exposed).

In this embodiment, after the offset sidewall 6 has been formed, part of the high dielectric constant gate insulating film 4 located in the external side to the offset sidewall 6 is removed, and then ion implantation for forming the n-type extension region 10 and the p-type pocket region 11 is performed. However, instead of performing these process steps, ion implantation for forming the n-type extension region 10 and the p-type pocket region 11 may be performed after the offset sidewall 6 is formed and with part of the high dielectric constant gate insulating film 4 having a reduced thickness remaining in the external side to the offset sidewall 6. Even in this manner, according to this embodiment, the part of the high dielectric constant gate insulating film 4 located in the external side to the offset sidewall 6 has a reduced thickness, so that increase in acceleration energy can be suppressed. Accordingly, a shallow junction can be formed in the n-type extension region 10 in a simple manner and thus device characteristics can be improved in a simple manner. In this case, ion implantation for forming an extension region and a pocket region of an MISFET having a different channel type or another power supply system and being provided on the same substrate may be performed after ion implantation for forming the n-type extension region 10 and the p-type pocket region 11 and then removal of the part of the high dielectric constant gate insulating film 4 located in the external side to the offset sidewall 6.

(Seventh Embodiment)

Hereafter, a method for fabricating a semiconductor device according to a seventh embodiment of the present invention will be described with reference to the accompanying drawings. FIGS. 13A through 13G are cross-sectional views illustrating respective steps for fabricating a semiconductor device according to the seventh embodiment.

Figure 13A:
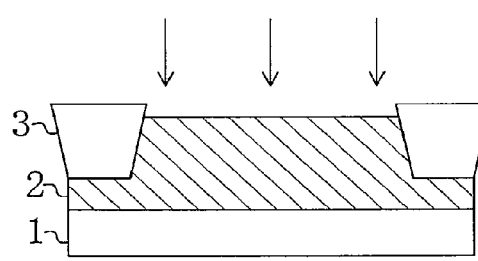
FIGS. 13A through 13G are cross-sectional views illustrating respective steps for fabricating a semiconductor device according to a seventh embodiment of the present invention.

First, as shown in FIG. 13A, a STI 3 which is to be an isolation region is selectively formed on a substrate 1 of for example, silicon and then, for example, B is ion implanted into the substrate 1 at an implantation energy of 300 keV and a dose of $1\times10^{13}$ cm$^{-2}$. Thus, a p-type well 2 which is to be an active region is formed. Subsequently, ion implantation (of B at an implantation energy of 150 keV and a dose of $1\times10^{13}$ cm$^{-2}$) for punch-through stopper formation and ion implantation (of B at an implantation energy of 20 keV and a dose of $5\times10^{12}$ cm$^{-2}$) for channel formation are performed.

Figure 13B:
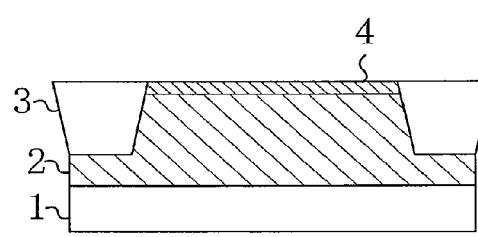

Next, as shown in FIG. 13B, as a buffer insulating film, for example, a silicon oxide film (not shown) is formed on the active region of the p-type well 2 surrounded by the STI 3 so as to have a thickness of about 0.5 nm and then, as a high dielectric constant film 4, for example, a HfSiON film is deposited thereon to a thickness of about 4 nm (i.e., about 1 nm in terms of an equivalent oxide thickness).

Figure 13C:
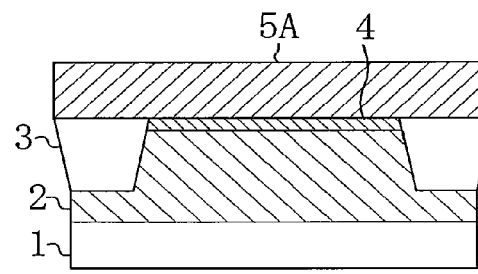

Next, as shown in FIG. 13C, for example, a gate electrode material film 5A is formed on the high dielectric constant gate insulating film 4 so as to have a thickness of about 100 nm.

Figure 13D:
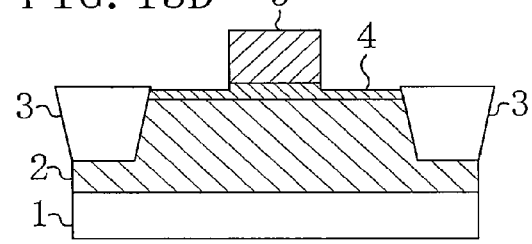

Next, a resist pattern (not shown) is formed on the gate electrode material film 5A so as to cover a gate electrode formation region, and then the gate electrode material film 5A is etched using the resist pattern as a mask, thereby forming, as shown in FIG. 13D, a gate electrode 5. Thereafter, part of the high dielectric constant gate insulating film 4 located in the external side to the gate electrode 5 is removed by a thickness of about 2 nm by selective etching. Thus, a thickness of part of the high dielectric constant gate insulating film 4 located in the external side to the gate electrode 5 can be reduced so that a remaining thickness of the part of the high dielectric constant gate insulating film 4 becomes about 2 nm.

Figure 13E:
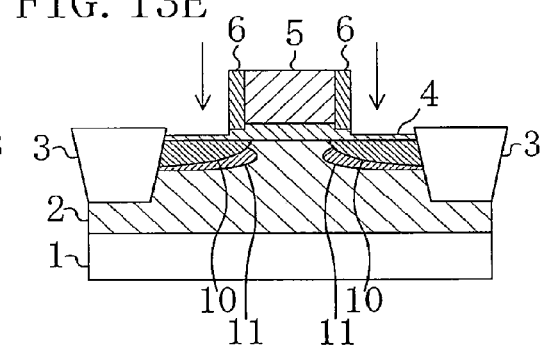

Next, an insulating film is deposited over the substrate 1 to a thickness of about 5 nm, and then the insulating film is etched back to form, as shown in FIG. 13E, an insulating offset sidewall 6 on each side surface of the gate electrode 5. Thereafter, part of the high dielectric constant gate insulating film 4 which is not covered by the gate electrode 5 and the offset sidewall 6 is further removed by about 1 nm. Thus, the thickness of part of the high dielectric gate insulating film 4 located in the external side to the offset sidewall 6 can be reduced to a thickness of about 1 nm. Then, using the gate electrode 5 and the offset sidewall 6 as a mask, for example, As is ion implanted into the substrate 1 at an implantation energy of 2 keV and a dose of $1\times10^{15}$ cm$^{-2}$, thereby forming an extension region 10. Thereafter, using the gate electrode 5 and the offset sidewall 6 as a mask, for example, B is ion implanted into the substrate 1 at an implantation energy of 10 keV and a dose of $3\times10^{13}$ cm$^{-2}$, thereby forming a p-type pocket region 11.

Figure 13F:
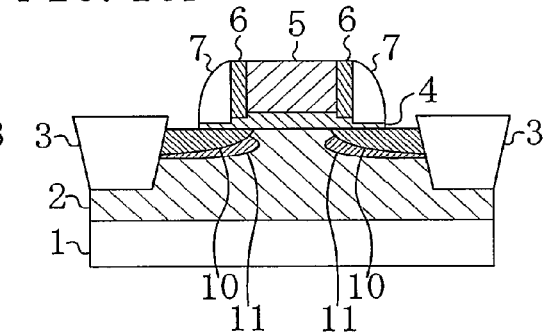

Next, an insulating film is deposited over the substrate 1 to a thickness of about 50 nm, and then the insulating film is etched back to form, as shown in FIG. 13F, an insulating sidewall 7 on each side surface of the gate electrode 5 with the offset sidewall 6 interposed therebetween.

Figure 13G:
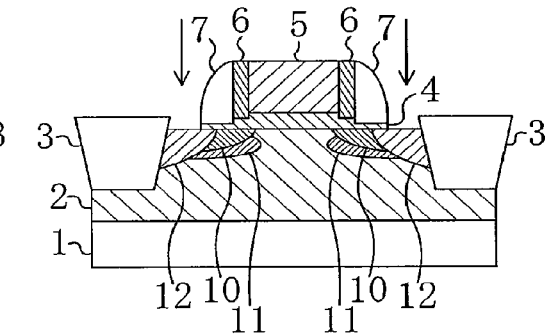

Next, using the gate electrode 5, the offset sidewall 6 and the sidewall 7 as a mask, for example, As is ion implanted into the substrate 1 at an implantation energy of 10 keV and a dose of $5\times10^{15}$ cm$^{-2}$, and then, for example, spike RTA (rapid thermal annealing) is performed at a temperature of about 1050° C., thereby activating the implanted impurity. Thus, as shown in FIG. 13G, n-type source/drain regions 12 are formed.

According to the above-described fabrication method of this embodiment, the MISFET structure (see FIG. 5) of the third embodiment can be realized in a relatively simple manner.

In this embodiment, the high dielectric constant gate insulating film 4E is formed so that the thickness of the high dielectric constant gate insulating film 4E is reduced in the part located under the offset sidewall 6 and then is further reduced in the part located in the external side to the offset sidewall 6. Therefore, even when ion implantation for forming the n-type extension region 10 is performed using the gate electrode 5 and the offset sidewall 6 as a mask, increase in acceleration energy can be suppressed at a minimum level. Accordingly, a shallow junction can be formed at an even shallower depth in the n-type extension region 10 in a simple manner and thus device characteristics can be improved in a simple manner.

In this embodiment, after the sidewall 7 has been formed, the part of the high dielectric constant gate insulating film 4 located in the external side to the sidewall 7 may be removed, for example, by wet etching using hydrofluoric acid or the like or selective dry etching. Moreover, in such a case, part of the high dielectric constant gate insulating film 4 located under each side end portion of the sidewall 7, i.e., each side end portion of the high dielectric constant gate insulating film 4 may be removed in a notch shape. Thus, the MISFET structure (see FIG. 8B) of the modified embodiment of the third embodiment can be realized in a simple manner.

In this embodiment, a target thickness for reduction in the thickness of the part of the high dielectric constant gate insulating film 4 located in the external side to the gate electrode 5 is not particularly limited either under the offset sidewall 6 or under the sidewall 7. However, for example, when an HfSiON film is used as the high dielectric constant gate insulating film 4, to suppress increase in a capacitance between a gate and a grain, the thickness of part of the high dielectric constant gate insulating film 4 located in the external side to the gate electrode 5 is preferably reduced to about 2 nm or less.

(Eighth Embodiment)

Hereafter, a method for fabricating a semiconductor device according to an eighth embodiment of the present invention will be described with reference to the accompanying drawings. In this embodiment, description will be made using a method for fabricating an n-type MISFET as an example. FIGS. 14A through 14G and FIGS. 15A through 15D are cross-sectional views illustrating respective steps for fabricating a semiconductor device according to the eighth embodiment.

Figure 14A:
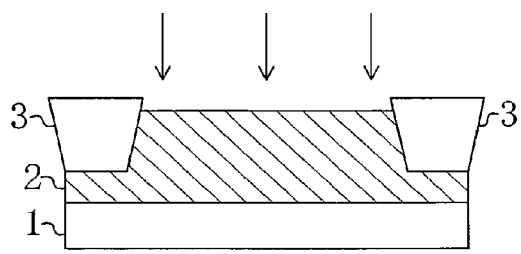
FIGS. 14A through 14G are cross-sectional views illustrating respective steps for fabricating a semiconductor device according to an eighth embodiment of the present invention.

First, as shown in FIG. 14A, for example, a STI 3 which is to be an isolation region is selectively formed on a substrate 1 of, for example, silicon and then, for example, B is ion implanted into the substrate 1 at an implantation energy of 300 keV and a dose of $1\times10^{13}$ cm$^{-2}$. Thus, a p-type well 2 which is to be an active region is formed. Subsequently, ion implantation (of B at an implantation energy of 150 keV and a dose of $1\times10^{13}$ cm$^{-2}$) for punch-through stopper formation and ion implantation (of B at an implantation energy of 20 keV and a dose of $5\times10^{12}$ cm$^{-2}$) for channel formation are performed.

Figure 14B:
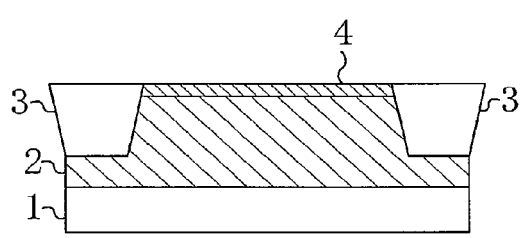

Next, as shown in FIG. 14B, as a buffer insulating film, for example, a silicon oxide film (not shown) is formed on the active region of the p-type well 2 surrounded by the STI 3 so as to have a thickness of about 0.5 nm and then, as a high dielectric constant film 4, for example, a HfSiON film is deposited thereon to a thickness of about 4 nm (i.e., about 1 nm in terms of an equivalent oxide thickness).

Figure 14C:
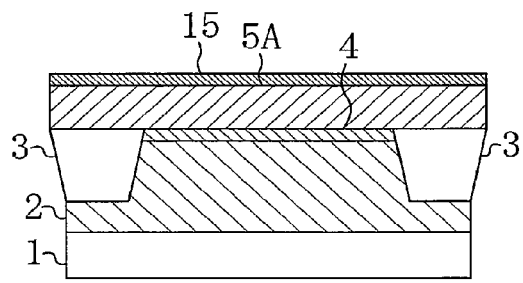

Next, as shown in FIG. 14C, as a gate electrode material film 5A, for example, a polysilicon film is formed on the high dielectric constant gate insulating film 4 so as to have a thickness of about 100 nm, and then as a cover film (protective film) 15, for example, a silicon oxide film is deposited over the gate electrode material film 5A to a thickness of about 10 nm.

Figure 14D:
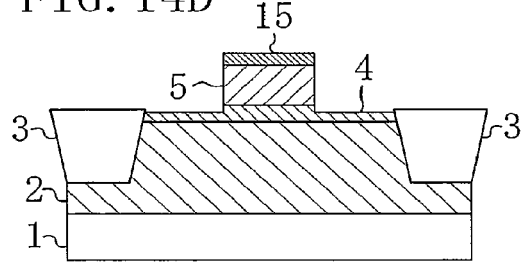

Next, a resist pattern (not shown) is formed on the cover film 15 so as to cover a gate electrode formation region, and then the cover film 15 and the gate electrode material film 5A are etched in this order using the resist pattern as a mask, thereby forming, as shown in FIG. 14D, a gate electrode 5 with its upper surface covered by the cover film 15. Thereafter, part of the high dielectric constant gate insulating film 4 located in the external side to the gate electrode 5 is removed by a thickness of about 2 nm by selective etching. Thus, a thickness of part of the high dielectric constant gate insulating film 4 located in the external side to the gate electrode 5 can be reduced so that a remaining thickness of the part of the high dielectric constant gate insulating film 4 becomes about 2 nm.

Figure 14E:
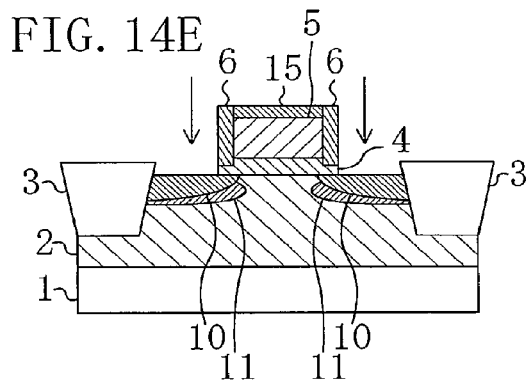

Next, an insulating film is deposited over the substrate 1 to a thickness of about 10 nm, and then the insulating film is etched back to form, as shown in FIG. 14E, an insulating offset sidewall 6 on each side surface of the gate electrode 5. Thereafter, part of the high dielectric constant gate insulating film 4 located in the external side to the offset sidewall 6 is removed, for example, by wet etching using hydrofluoric acid or the like or selective dry etching. Subsequently, using the gate electrode 5 and the offset sidewall 6 as a mask, for example, As is ion implanted into the substrate 1 at an implantation energy of 2 keV and a dose of $1\times10^{15}$ cm$^{-2}$, thereby forming an n-type extension region 10. Thereafter, using the gate electrode 5 and the offset sidewall 6 as a mask, for example, B is ion implanted into the substrate 1 at an implantation energy of 10 keV and a dose of $3\times10^{13}$ cm$^{-2}$, thereby forming a p-type pocket region 11.

Figure 14F:
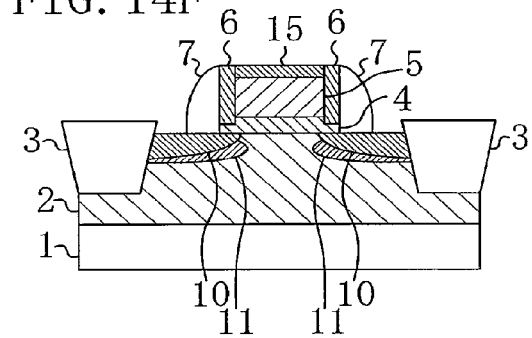

Next, an insulating film (for example, a SiN film) is deposited over the substrate 1 to a thickness of about 50 nm, and then the insulating film is etched back to form, as shown in FIG. 14F, an insulating sidewall 7 on each side surface of the gate electrode 5 with the offset sidewall 6 interposed therebetween.

Figure 14G:
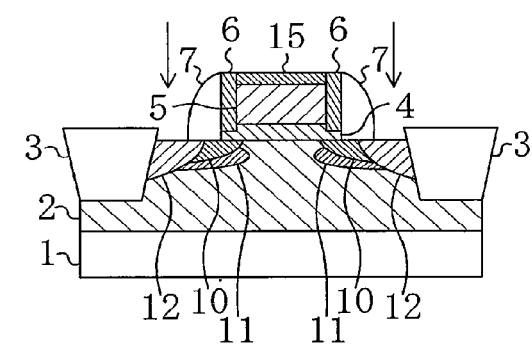

Next, using the gate electrode 5, the offset sidewall 6 and the sidewall 7 as a mask, for example, As is ion implanted into the substrate 1 at an implantation energy of 10 keV and a dose of $5\times10^{15}$ cm$^{-2}$, and then, for example, spike RTA (rapid thermal annealing) is performed at a temperature of about 1050° C., thereby activating the implanted impurity. Thus, as shown in FIG. 14G, n-type source/drain regions 12 are formed.

Figure 15A:
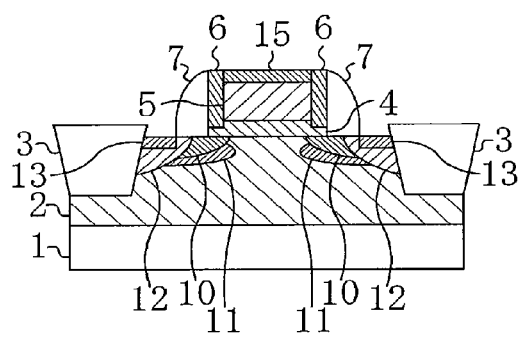
FIGS. 15A through 15D are cross-sectional views illustrating respective steps for fabricating a semiconductor device according to the eighth embodiment of the present invention.

Next, a metal film (for example, a Ni film) is deposited over the substrate 1 to a thickness of about 10 nm, and RTA is performed to bring a silicon portion of the substrate 1 and the metal film into reaction. Thus, as shown in FIG. 15A, a silicide layer 13 is formed on the n-type source/drain regions 12. Thereafter, unreacted part of the metal film which remains on the substrate 1 is exfoliated or removed.

Figure 15B:
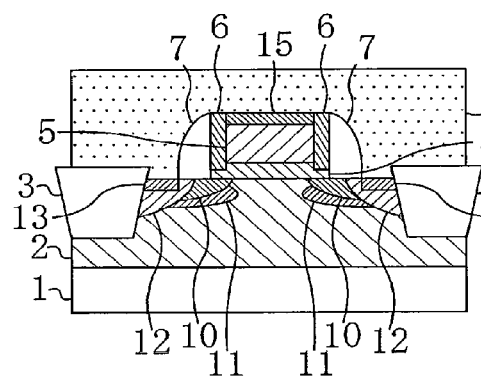

Next, as shown in FIG. 15B, an interlayer insulating film 14 is deposited over the substrate 1 as well as the gate electrode 5 to a thickness of about 400 nm.

Figure 15C:
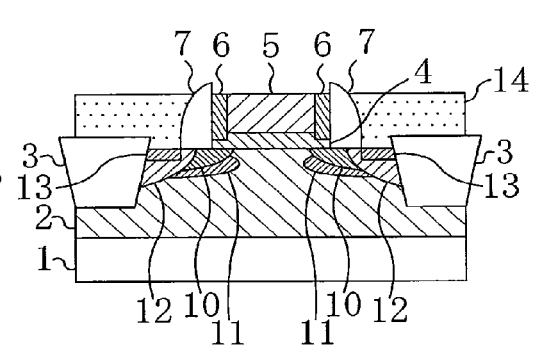

Next, as shown in FIG. 15C, the interlayer insulating film 14 is polished, for example, by CMP (chemical mechanical polishing) so that a surface of the interlayer insulating film 14 becomes at the same level as the upper surface of the cover film 15, and then the exposed cover film 15 is removed by etching. In this case, respective upper portions of the interlevel insulating film 14 which has undergone through CMP and the offset sidewall 6 are also removed.

Figure 15D:
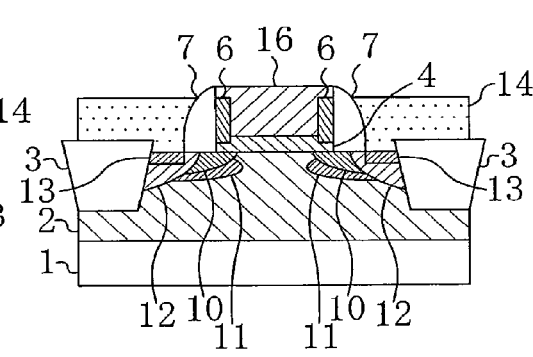
Figure 16A:
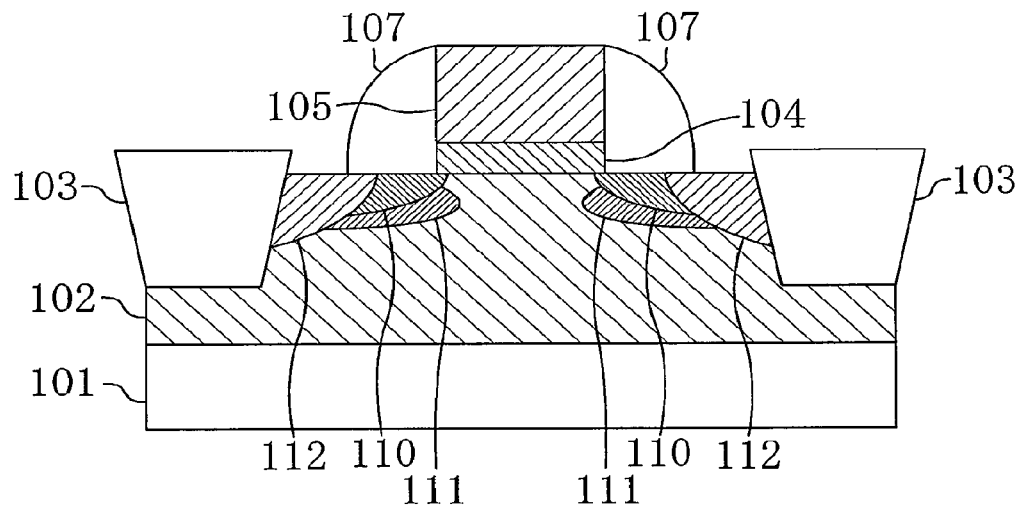
FIGS. 16A and 16B are cross-sectional views illustrating a structure of a known MISFET, respectively.
Figure 16B:
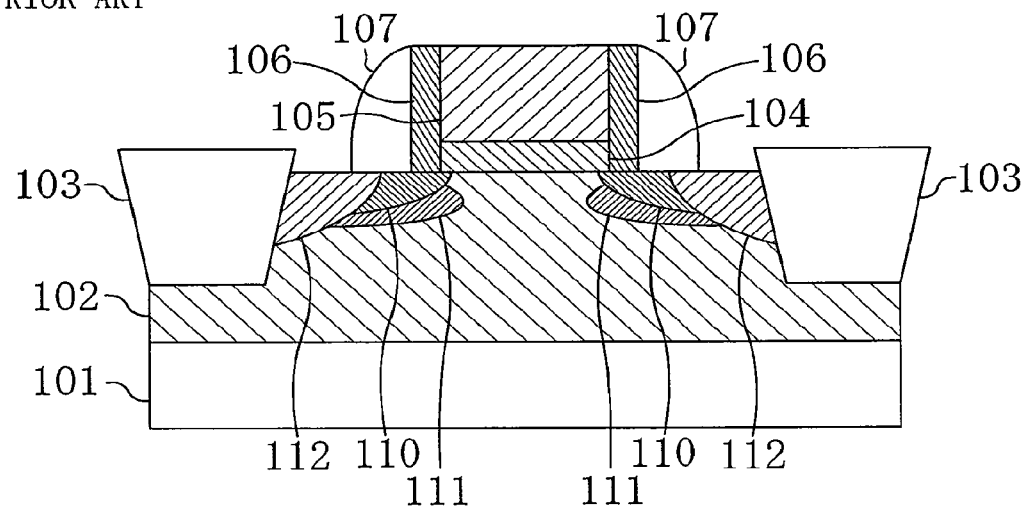

Next, a metal film (for example, a Ni film) is deposited over the substrate 1 to a thickness of about 100 nm, and then RTA is performed to bring a silicon portion of the gate electrode 5 and the metal film into reaction. Thus, as shown in FIG. 15D, a fully silicided gate electrode 16 (obtained by siliciding the entire region over the high dielectric constant gate insulating film 4) is formed.

According to the above-described fabrication method of this embodiment, the MISFET structure (see FIG. 2) of the second embodiment using a FUSI (full silicide) structure can be realized in a relatively simple manner.

In this embodiment, when the offset sidewall 6 has been formed and then part of the high dielectric constant gate insulating film 4 located in the external side to the offset sidewall 6 is removed, for example, by wet etching using hydrofluoric acid or the like, part of the high dielectric constant gate insulating film 4 located under each side end portion of the offset sidewall 6, i.e., each side portion of the high dielectric constant gate insulating film 4 may be removed in a notch shape so that a notch is provided. Thus, the MISFET structure (see FIG. 7) of the first modified example of the second embodiment using a FUSI structure can be realized in a simple manner.

In this embodiment, a target thickness for reduction in the thickness of the part of the high dielectric constant gate insulating film 4 located in the external side to the gate electrode 5 is not particularly limited. However, for example, when an HfSiON film is used as the high dielectric constant gate insulating film 4, to suppress increase in a capacitance between a gate and a grain, the thickness of part of the high dielectric constant gate insulating film 4 located in the external side to the gate electrode 5 is preferably reduced to about 2 nm or less (so that a surface of the substrate 1 is not exposed).

In this embodiment, after the offset sidewall 6 has been formed, part of the high dielectric constant gate insulating film 4 located in the external side to the offset sidewall 6 is removed, and then ion implantation for forming the n-type extension region 10 and the p-type pocket region 11 is performed. However, instead of performing these process steps, ion implantation for forming the n-type extension region 10 and the p-type pocket region 11 may be performed after the offset sidewall 6 is formed and with part of the high dielectric constant gate insulating film 4 having a reduced thickness remaining in the outer side offset sidewall 6. Even in this manner, according to this embodiment, the part of the high dielectric constant gate insulating film 4 located in the external side to the offset sidewall 6 has a reduced thickness, so that increase in acceleration energy can be suppressed. Accordingly, a shallow junction can be formed in the n-type extension region 10 in a simple manner and thus device characteristics can be improved in a simple manner. In this case, ion implantation for forming an extension region and a pocket region of an MISFET having a different channel type or another power supply system and formed on the same substrate may be performed after ion implantation for forming the n-type extension region 10 and the p-type pocket region 11 and then removal of the part of the high dielectric constant gate insulating film 4 located in the external side to the offset sidewall 6.

In this embodiment, the MISFET structure of the second embodiment using a FUSI structure has been formed. However, instead of forming the MISFET structure of the second embodiment, the MISFET structure of the first embodiment, the modified example of the first embodiment, each of the modified examples of the second embodiment, the third embodiment, the modified example of the third embodiment, the fourth embodiment or the modified example of the fourth embodiment may be formed using a FUSI structure.

In each of the first through eighth embodiments, a single layer structure of a SiN film has been used as an example of the sidewall 7. However, instead of the single layer structure of a SiN film, for example, a double layer structure of a combination of an oxide film (SiO$_2$ film) and a nitride film (SiN film) (for example, including a SiO$_2$ layer as an lower layer and a SiN film as an upper layer), a triple layer structure (for example including an SiO$_2$ film as a lower layer, a SiN film as a middle layer and a SiO$_2$ film as an upper layer) or the like may be used.

In each of the first through eighth embodiments, instead of the n-type extension region 10, a LDD may be formed.

In each of the fifth through eighth embodiments, instead of the n-type MISFET, a p-type MISFET may be formed.

In each of the fifth through eighth embodiments, to prevent deterioration of the interface of a gate insulating film and a gate electrode, a buffer insulating film may be formed between the gate electrode 5 and the high dielectric constant gate insulating film 4 so as to have a thickness of about 0.2 nm.

In each of the first through eighth embodiments, a shape of each side surface of the high dielectric constant gate insulating film 4 in which the notch 20 is provided in the part located under each side end portion of the sidewall 7 or the offset sidewall 6 is not limited to a semicircular shape shown in FIG.

6, 7, 8 or 10. For example, each side surface of the high dielectric constant gate insulating film 4 may be a perpendicular plane to the substrate surface. That is, a side surface of the high dielectric constant gate insulating film 4 may be located at a predetermined distance from a side end surface of the sidewall 7 or the offset sidewall 6 toward the gate electrode 5.

What is claimed is:

1. A semiconductor device comprising:
    a high dielectric constant gate insulating film formed on an active region in a substrate;
    a gate electrode formed on the high dielectric constant gate insulating film;
    a insulating sidewall formed on each side surface of the gate electrode; and
    wherein the high dielectric constant gate insulating film is continuously formed so as to extend from under the gate electrode to under the insulating sidewall, and
    an end of the high dielectric constant gate insulating film under the insulating sidewall is located at a predetermined distance from an outer end of the insulating sidewall toward the gate electrode.

2. The semiconductor device of claim 1, further comprising a buffer insulating film between the substrate and the high dielectric constant gate insulating film.

3. The semiconductor device of claim 2, wherein the buffer insulating film is a silicon oxide film.

4. The semiconductor device of claim 2, wherein
    the buffer insulating film is continuously formed so as to extend from under the gate electrode to under the insulating sidewall, and
    an end of the buffer insulating film is located at a predetermined distance from an outer end of the insulating sidewall toward the gate electrode.

5. The semiconductor device of claim 1, wherein
    a smallest thickness of part of the high dielectric constant gate insulating film located under the insulating sidewall is smaller than that of part of the high dielectric constant gate insulating film located under the gate electrode.

6. The semiconductor device of claim 1, wherein the high dielectric constant gate insulating film is formed of a Hf based oxide.

7. The semiconductor device of claim 1, wherein the high dielectric constant gate insulating film is formed of a HfSiON film.

8. The semiconductor device of claim 1, wherein
    an extension region of a first conductivity type is formed in part of the active region located under the insulating sidewall, and
    a pocket region of a second conductivity type is formed in part of the active region located under the extension region.

9. The semiconductor device of claim 8, wherein
    each of source/drain regions of a first conductivity type is formed in part of the active region located in an external side to the extension region and the pocket region when viewed from the gate electrode.

10. The semiconductor device of claim 1, wherein
    a part of the high dielectric constant gate insulating film located under the insulating sidewall includes a notch at the end thereof.

11. The semiconductor device of claim 1, wherein
    a part of the high dielectric constant gate insulating film located under the insulating sidewall has a thickness of 2 nm or less.

12. The semiconductor device of claim 2, wherein
    an end of the buffer insulating film is located at a predetermined distance from a side end of the gate electrode toward the insulating sidewall.

13. The semiconductor device of claim 1, wherein
    the end of the high dielectric constant gate insulating film is located at a predetermined distance from a side end of the gate electrode toward the insulating sidewall.

14. The semiconductor device of claim 1, wherein
    the insulating sidewall has a double layer structure including an oxide film and a nitride film.

15. The semiconductor device of claim 1, wherein
    wherein the insulating sidewall has a triple layer structure including a first oxide film, a nitride film and a second oxide film.

16. The semiconductor device of claim 1, wherein
    a width of the high dielectric constant gate insulating film along a gate length is larger than a width of the gate electrode along the gate length.

17. The semiconductor device of claim 1, wherein
    a width of a bottom surface of the high dielectric constant gate insulating film along a gate length is larger than a width of a bottom surface of the gate electrode along the gate length.

18. The semiconductor device of claim 1, wherein
    the high dielectric constant gate insulating film has a relative dielectric constant of 10 or more.

19. The semiconductor device of claim 1, wherein
    the high dielectric constant gate insulating film has a larger relative dielectric constant than that of the insulating sidewall.

20. The semiconductor device of claim 1, wherein
    the high dielectric constant gate insulating film is formed to have a convex cross-sectional shape.

21. The semiconductor device of claim 1, wherein
    the end of the high dielectric constant gate insulating film located under the insulating sidewall has a tapered surface.

22. The semiconductor device of claim 1, wherein
    the high dielectric constant gate insulating film located under the insulating sidewall has a thickness which becomes smaller toward the end thereof.

\* \* \* \* \*